US012615762B2

(12) United States Patent (10) Patent No.: US 12,615,762 B2

Sharma et al. (45) Date of Patent: Apr. 28, 2026

(54) THREE-DIMENSIONAL DYNAMIC RANDOM ACCESS MEMORY WITH STACKED SEMICONDUCTOR STRUCTURES

(71) Applicant: Intel Corporation, Santa Clara, CA (US)

(72) Inventors: Abhishek Sharma, Portland, OR (US); Tahir Ghani, Portland, OR (US); Anand Murthy, Portland, OR (US); Wilfred Gomes, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 724 days.

(21) Appl. No.: 17/856,868

(22) Filed: Jul. 1, 2022

(65) Prior Publication Data

US 2024/0008259 A1 Jan. 4, 2024

(51) Int. Cl.
*H10B 12/00* (2023.01)

(52) U.S. Cl.
CPC ................................... *H10B 12/36* (2023.02)

(58) Field of Classification Search
CPC ...... H10B 12/36; H10B 12/482; H10B 12/05; H10B 12/03
See application file for complete search history.

(56) References Cited

U.S. PATENT DOCUMENTS

| | | | |
|---|---|---|---|
| 5,028,988 A | 7/1991 | Porter et al. | |
| 5,943,567 A | 8/1999 | Chang | |
| 11,665,877 B1 | 5/2023 | Zhang et al. | |
| 12,191,270 B2 | 1/2025 | Wang et al. | |
| 2003/0227041 A1 | 12/2003 | Atwood et al. | |
| 2015/0019802 A1 | 1/2015 | Kamal et al. | |
| 2016/0049197 A1 | 2/2016 | Park et al. | |
| 2019/0348112 A1 | 11/2019 | Gopinath et al. | |
| 2020/0035683 A1 | 1/2020 | Sharma et al. | |
| 2020/0135266 A1 | 4/2020 | Kumar et al. | |
| 2020/0185392 A1 | 6/2020 | Makosiej et al. | |
| 2020/0257604 A1 | 8/2020 | Roh et al. | |
| 2021/0082776 A1 | 3/2021 | Wong et al. | |
| 2021/0257370 A1* | 8/2021 | Son ........................ | H10B 12/03 |
| 2021/0296445 A1 | 9/2021 | Lee et al. | |
| 2021/0358891 A1 | 11/2021 | Chuang et al. | |
| 2021/0366819 A1 | 11/2021 | Chiang et al. | |
| 2022/0013523 A1 | 1/2022 | Cheng | |
| 2022/0085161 A1 | 3/2022 | Noh et al. | |
| 2022/0093593 A1 | 3/2022 | Yang | |
| 2022/0130853 A1 | 4/2022 | Sharangpani et al. | |
| 2022/0190129 A1 | 6/2022 | Wei et al. | |
| 2022/0308995 A1 | 9/2022 | Gomes et al. | |
| 2022/0336474 A1 | 10/2022 | Liaw | |

(Continued)

*Primary Examiner* — Mohammad A Rahman

(74) *Attorney, Agent, or Firm* — Essential Patents Group, LLP

(57) ABSTRACT

Integrated circuit dies, systems, and techniques are described herein related to three-dimensional dynamic random access memory. A memory device includes vertically aligned semiconductor structures coupled to independent gate structures, corresponding vertically aligned capacitors each coupled to a corresponding one of the semiconductor structures, and a bit line contact extending vertically across a depth of the semiconductor structures and coupled to each of the semiconductor structures.

22 Claims, 17 Drawing Sheets

(56)         References Cited

U.S. PATENT DOCUMENTS

| | | |
|---|---|---|
| 2022/0359444 A1 | 11/2022 | Cantaloube et al. |
| 2023/0056640 A1 | 2/2023 | Sharma et al. |
| 2023/0067765 A1 | 3/2023 | Sharma et al. |
| 2023/0085033 A1* | 3/2023 | Xie ...................... H10D 62/118 |
| | | 257/321 |
| 2023/0090092 A1 | 3/2023 | Lilak et al. |
| 2023/0114024 A1 | 4/2023 | Gardner et al. |
| 2023/0275067 A1 | 8/2023 | Sharma et al. |
| 2023/0317146 A1 | 10/2023 | Sharma et al. |
| 2023/0380194 A1 | 11/2023 | Chang et al. |
| 2023/0385491 A1* | 11/2023 | Li ........................... G06F 30/39 |
| 2023/0420371 A1 | 12/2023 | Radens et al. |
| 2024/0222271 A1 | 7/2024 | Sharma et al. |

* cited by examiner

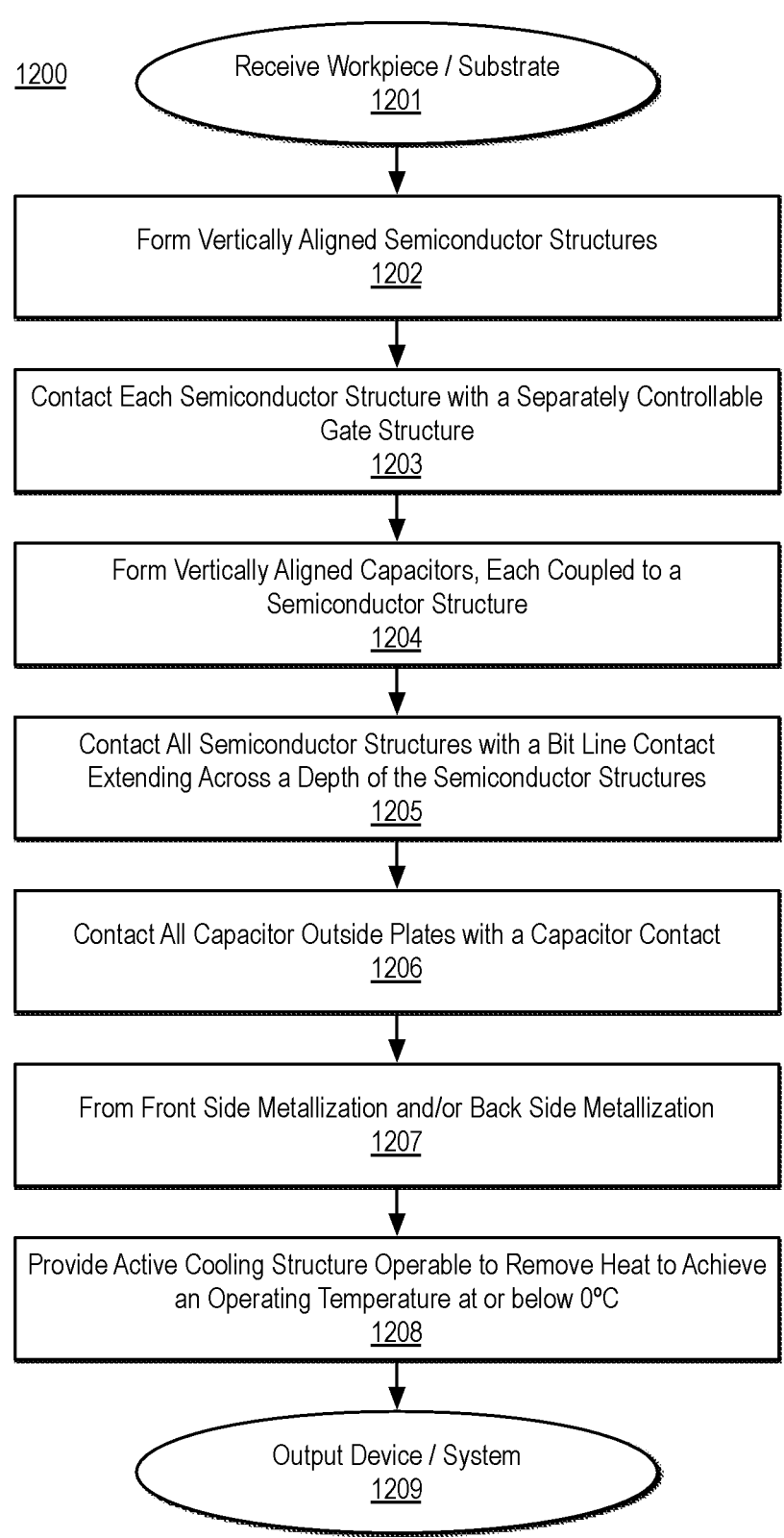

1200

Receive Workpiece / Substrate
1201

Form Vertically Aligned Semiconductor Structures
1202

Contact Each Semiconductor Structure with a Separately Controllable
Gate Structure
1203

Form Vertically Aligned Capacitors, Each Coupled to a
Semiconductor Structure
1204

Contact All Semiconductor Structures with a Bit Line Contact
Extending Across a Depth of the Semiconductor Structures
1205

Contact All Capacitor Outside Plates with a Capacitor Contact
1206

From Front Side Metallization and/or Back Side Metallization
1207

Provide Active Cooling Structure Operable to Remove Heat to Achieve
an Operating Temperature at or below 0°C
1208

Output Device / System
1209

FIG. 12

THREE-DIMENSIONAL DYNAMIC RANDOM ACCESS MEMORY WITH STACKED SEMICONDUCTOR STRUCTURES

BACKGROUND

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. Notably, there is a desire to further condense memory devices such as dynamic random access memory (DRAM) devices. Such DRAM may be used in any computational context.

It is with respect to these and other considerations that the present improvements have been needed. Such improvements may become critical as the desire to improve computational efficiency become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 8 illustrates a cross-sectional view of a low temperature 3D dynamic random access memory integrated circuit system using die level cooling;

FIG. 12 is a flow diagram illustrating an example process for forming a low temperature 3D dynamic random access memory integrated circuit system;

DETAILED DESCRIPTION

Figure 1:
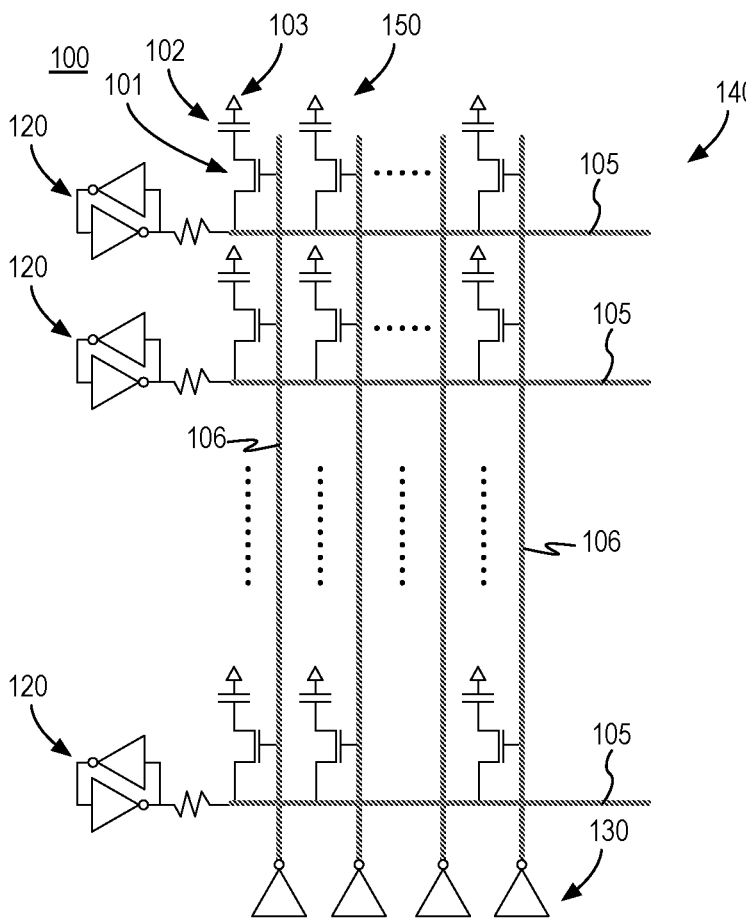
FIG. 1 illustrates a circuit diagram of an example 3D dynamic random access memory device inclusive of a one transistor-one capacitor array.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. As used herein, the term predominantly indicates the predominant constituent (i.e., greater than 50% is the constituent of greatest proportion in the layer or material). The term substantially pure indicates the constituent is not less than 99% of the material. The term pure indicates the constituent is not less than 99.5% of the material and the term completely pure indicates the constituent is not less than 99.9% of the material. As used herein, the terms "monolithic", "monolithically integrated", and similar terms indicate the components of the monolithic overall structure form an indivisible whole not reasonably capable of being separated.

Integrated circuit dies, systems, circuits, and techniques are described herein related to three-dimensional (3D) dynamic random access memory (DRAM) having vertically stacked semiconductor structures for improved memory density.

Embodiments discussed herein provide advantageous 3D DRAM for use in any computational device or context. In some embodiments, the devices or systems are deployed at very low temperatures, such as at or below 0° C. In some embodiments, very low temperature deployment allows for 3D DRAM having semiconductor structures with very small cross-sectional dimensions such as thicknesses in the range of 0.5 to 20 nm with thicknesses of not more than 2 nm being used in some contexts. In some embodiments, the 3D DRAM is implemented in an integrated circuit (IC) die including or coupled to cooling structure operable to remove heat from the IC die to achieve an operating temperature at the very low temperature. As used herein, the term cooling structure or active cooling structure indicates a device that uses power to provide cooling (e.g., via flow of a coolant, immersion in a coolant, etc.). Notably, the cooling structure or active cooling structure need not be in operation to be labeled as such. The active cooling structure may be part of the IC die and/or provided separately from the IC die. In some contexts, an active cooling structure is not needed as the IC die is deployed in a very low temperature environment such as in any of a subpolar oceanic climate, a subarctic climate, an arctic climate, a tundra climate, an ice cap climate, or any other environment of sustained cold temperatures. In some embodiments, the discussed 3D DRAM is implemented in room temperature (or room temperature devices) without use of such cooling structures (although typical cooling techniques such as heat sinks may be used).

In some embodiments, a 3D DRAM includes a number of vertically aligned semiconductor structures. As used herein, the term semiconductor structure indicates a structure of semiconductor material and is inclusive of nanowires or nanoribbons, nanosheets, or fins. Each semiconductor structure includes a channel coupled to and controllable by a gate. The channel is coupled to a source and a drain. The 3D DRAM further includes a corresponding number of independent gate structures (i.e., a gate structure for each semiconductor structure) such that each gate structure is coupled to a corresponding one of the semiconductor structures. The gate structures may be shared across laterally aligned ones of semiconductor structures in different sets of semiconductor structures to form word lines, for example. As used herein, the term gate structure indicates an electrode coupled to a channel of a semiconductor structure and is inclusive of gate structures including a gate dielectric on the semiconductor structure and a gate electrode on the gate dielectric. The 3D DRAM further includes a corresponding number of vertically aligned capacitors (i.e., one capacitor for each semiconductor structure) such that each capacitor is coupled to a corresponding one of the semiconductor structures and is laterally aligned with a corresponding one of the gate structures. The capacitors each include an inner plate and an outer plate separated by a capacitor dielectric. Each gate structure controls access to the corresponding capacitor. For example, the capacitor may couple to a source or drain of a transistor including the semiconductor structure with the other of the source or drain being coupled to a bit line. Thereby, the bit line and the gate structure, which provides the word line, control access to the capacitor. The 3D DRAM further includes a bit line contact, which provides the bit line, such that the bit line contact extends vertically across a depth of the semiconductor structures and is coupled to each of the semiconductor structures. Thereby, the 3D DRAM includes an array of one transistor-one capacitor (1T-1C) 3D DRAM cells such that the capacitor of each cell is operable under control of the bit line contact (which controls a number of cells) and the gate structure or word line (which controls a number of orthogonal cells). Such 3D DRAM is compact and efficient, and other advantages will be evident based on the following disclosure. In addition, such 3D DRAM may utilize shared bit lines between cells and/or shared outer capacitor plate contact lines for additional cell efficiency. Such embodiments are discussed further herein below.

As discussed, an IC die including 3D DRAM may be deployed in a very low temperature context. In some embodiments, the operating temperature of the IC die is maintained at or below 0° C. In some embodiments, the operating temperature of the IC die is maintained at or below about −196° C. (i.e., using liquid nitrogen as the coolant). In some embodiments, the operating temperature of the IC die is maintained at or below about −25° C. In some embodiments, the operating temperature of the IC die is maintained at or below about −50° C. In some embodiments, the operating temperature of the IC die is maintained at or below about −70° C. In some embodiments, the IC die is maintained at or below about −100° C. Other temperatures may be used based on coolant, environment, and so on. In operation at such very low temperatures, the 3D DRAM may see a substantial boost in performance relative to operation at higher temperatures inclusive of increased carrier mobility, reduced contact resistance, and reduced leakage. Furthermore, such very low temperature deployment may allow for reduced semiconductor structure size and further 3D DRAM efficiency.

FIG. 1 illustrates a circuit diagram of an example 3D dynamic random access memory device 100 inclusive of a one transistor-one capacitor array 140, arranged in accordance with at least some implementations of the present disclosure. As shown in FIG. 1, 3D DRAM device 100 includes sense amplifiers 120 and word line drivers 130, which provide peripheral control circuitry for 3D DRAM device 100. 3D DRAM device 100 may include other peripheral circuitry as known in the art.

3D DRAM device 100 further includes a 1T-1C array 140 including any number of 1T-1C cells 150 such that each of 1T-1C cells 150 includes a transistor 101 and a capacitor 102. Furthermore, each of 1T-1C cells 150 is accessed by a bit line 105 and a word line 106. Using bit lines 105 and word lines 106, each of 1T-1C cells 150 may be individually accessed. For example, each bit line 105 accesses a row of 1T-1C cells 150 and each word line 106 accesses a column of 1T-1C cells 150 such that each of 1T-1C cells 150 may be addressed by row and column.

As shown, each of 1T-1C cells 150 includes a transistor 101 and a capacitor 102. For example, a source or drain of transistor 101 is coupled to one of bit lines 105 and the other of the source and drain is coupled to a capacitor 102, which is turn coupled to a ground 103. In some embodiments, grounds 103 are coupled to one another as discussed further herein below. Also as shown, the gate of transistor 101 is coupled to and controllable by one of word lines 106. In practice, when a word line 106 is ON, each corresponding transistor 101 coupled to the word line is ON and data may be written to capacitor 102 using a signal on the corresponding bit line 105. Looking at it another way, when a data signal is provided on one of bit lines, the data (i.e., a bit) is only written to a capacitor 102 when the corresponding word line 106 is ON. 3D DRAM device 100 may be implemented using any 3D DRAM structure(s) discussed herein. Furthermore, 3D DRAM device 100 may be implemented an IC die or other context for use in a compute environment.

Figure 2A:
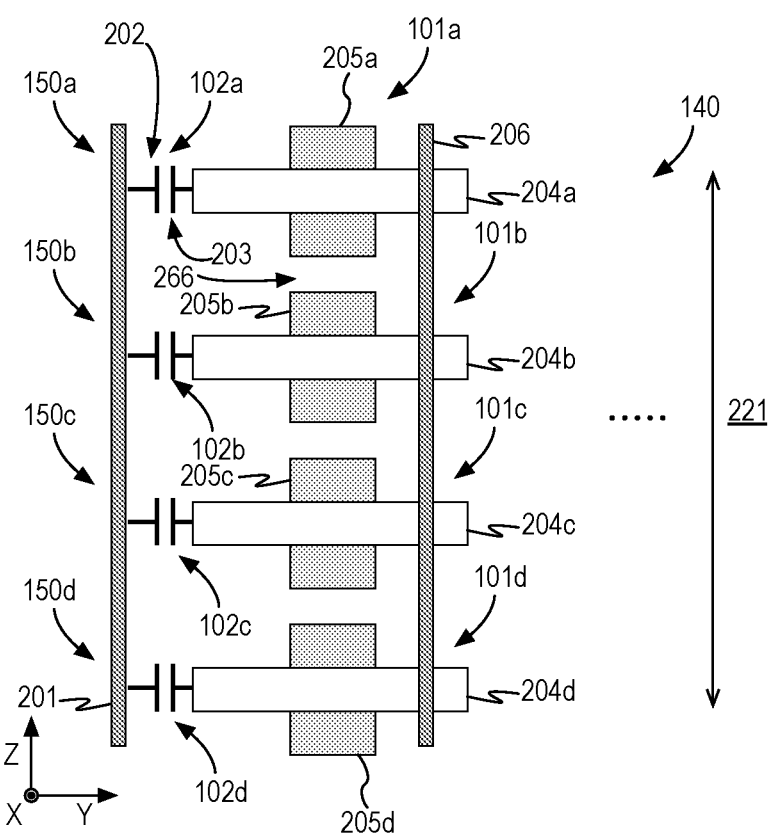
FIG. 2A illustrates a cross-sectional view of an example 3D dynamic random access memory device including a portion of a one transistor-one capacitor array.

FIG. 2A illustrates a cross-sectional view of an example 3D dynamic random access memory device 200 including a portion of one transistor-one capacitor array 140, arranged in accordance with at least some implementations of the present disclosure. In FIG. 2A, some elements such as capacitors are shown in circuit diagram form for the sake of clarity of presentation. Other elements are shown in accordance with implementation in an IC die, for example. As shown in FIG. 2A, a 1T-1C cell 150a includes a transistor 101a and a capacitor 102a. Other 1T-1C cells 150b, c, d include a transistor 101b and a capacitor 102b, a transistor 101c and a capacitor 102c, and a transistor 101d and a capacitor 102d, and so on such that each 1T-1C cell 150 includes a transistor 101 and a capacitor 102. 1T-1C array 140 includes a number of interconnected 1T-1C cells 150.

For example, 1T-1C cell 150a includes transistor 101a and capacitor 102a. Transistor 101a includes a semiconductor structure 204a, a gate structure 205a that provides one of word lines 106, and a source and drain (not labeled). One of the source or drain is coupled to an inner capacitor plate 203 of capacitor 102a. Capacitor 102a further includes a capacitor dielectric (not shown) and an outer capacitor plate 202. The other of the source and drain of transistor 101a is coupled to a bit line contact 206. Thereby, 1T-1C cells 150 in accordance with the circuitry of FIG. 1 are provided. In a similar manner, another 1T-1C cell 150b includes transistor 101b and capacitor 102b. Transistor 101b includes a semiconductor structure 204b, a gate structure 205b that provides another one of word lines 106, and a source and drain. One of the source or drain is coupled to an inner plate of capacitor 102b, which also includes a capacitor dielectric (not shown) and an outer plate. The other of the source and drain of transistor 101a is coupled to a bit line contact 206. The same is true of additional 1T-1C cells 150c, d, which include transistors 101c, d, which are controlled by gate structures 205c, d, as well as capacitors 102c, d, respectively.

Notably, 3D DRAM device 200 includes vertically aligned semiconductor structures 204a-d. Herein, the term vertical is with respect to the z-axis and the term aligned indicates at least a portion of such structures are aligned in the pertinent direction or axis. The term fully aligned indicates an entirety of such structures are aligned in the pertinent direction or axis. In some embodiments, semiconductor structures 204a-d are semiconductor nanoribbons, nanosheets, fins, or the like, fabricated based on etch of sacrificial material layers between the desired semiconductor structure layers. Semiconductor structures 204a-d may include any suitable semiconductor material. In some embodiments, semiconductor structures 204a-d include a Group IV material (e.g., silicon). In some embodiments, semiconductor structures 204a-d include a substantially monocrystalline material. Semiconductor structures 204a-d layers 204 may include any number of channel semiconductors, ribbons, or layers over the substrate such as three, four, five, tens, or even a hundred or more layers. In some embodiments, semiconductor structures 204a-d include silicon (e.g., monocrystalline silicon, Si) and the removed sacrificial layers include silicon germanium.

Semiconductor structures 204a-d may have any suitable dimensions. In some embodiments, semiconductor structures 204a-d have a thickness (i.e., in the z-dimension) in the range of 0.5 to 20 nm. In some embodiments, semiconductor structures 204a-d have a thickness in the range of 0.5 to 10 nm. In some embodiments, semiconductor structures 204a-d have a thickness in the range of 8 to 20 nm. In particular, as discussed herein, 3D DRAM device may advantageously be operated at very cold temperatures such that the transistors and capacitors of the 3D DRAM device operate efficiently with low leakage, high mobility, and other advantages. Such very cold temperatures may allow for efficient operation of semiconductor structures 204a-d having reduced thicknesses. In some embodiments, semiconductor structures 204a-d have a thickness in the range of not more than 2 nm. In some embodiments, semiconductor structures 204a-d have a thickness of not more than 2 nm and a cooling structure is used to remove heat from an IC die including the 3D DRAM to achieve an operating temperature of the IC die at or below –25° C.

As shown, each of semiconductor structures 204a-d is contacted by an independent gate structure 205a-d. As used herein, the term independent with respect to an electrical component such as a gate structure or word line or the like indicates the component is separately controllable. In this context, each gate structure provides a separately controllable word line. Such gate structures 205a-d are separated by gaps 266 that may be filled with a dielectric material such as an isolation material. The isolation may be any amorphous material suitable for providing electrical isolation. In some embodiments, the isolation is silicon dioxide. Other known dielectric materials may also be employed such as carbon-doped oxides, siloxane derivatives, and the like.

Gate structures 205a-d each include a gate dielectric (not shown) on a channel portion of a corresponding one of semiconductor structures 204a-d and a gate electrode on the gate dielectric. The gate dielectric may include one layer or a stack of layers including silicon oxide, silicon dioxide ($SiO_2$), and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate electrode is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. For a PMOS transistor, metals that may be used for the gate electrode include, but are not limited to, ruthenium, palladium, platinum, cobalt, nickel, and conductive metal oxides, e.g., ruthenium oxide. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide.

Furthermore, each of semiconductor structures 204a-d is coupled to an individual one of capacitors 102a-d such that gate structures 205a-d control access to capacitors 102a-d. For example, gate structures 205a-d provide word lines for 3D DRAM device 200 and the term word line may be used to characterize gate structures 205a-d. As shown, outer plates of capacitors 102a-d are coupled to a shared capacitor contact or conductor 201. For example, shared capacitor contact 201 may couple each of capacitors 102a-d to a ground rail. Capacitors 102a-d are vertically aligned and may include any suitable capacitor structure such as lateral plate/dielectric/plate capacitors or wrap around capacitors, as discussed further herein below.

3D DRAM device 200 further includes a bit line contact 206, which may be any of bit lines 105 such that bit line contact 206 extends vertically across a depth 221 of semiconductor structures 204a-d and bit line contact 206 is coupled to each of the semiconductor structures 204a-d. The term depth 221 of semiconductor structures 204a-d indicates a distance along the z-axis that allows coupling to each of semiconductor structures 204a-d. For example, depth 221 extends at least from a bottom of semiconductor structure 204a to a top of semiconductor structure 204d. Bit line contact 206 may be a single material component or several material components conductively coupled to form a single bit line contact 206.

The structure of the portion of 1T-1C array 140 illustrated may then be repeated in the y-axis such that 1T-1C array 140 includes a shared capacitor contact, a number of vertically aligned capacitors, a number of corresponding transistors having independent gate structures (word lines) and a shared bit line, another shared capacitor contact, another number of vertically aligned capacitors, another number of corresponding transistors having independent gate structures (word lines) and a shared bit line, and so on. Furthermore, the structure of the portion of 1T-1C array 140 illustrated may also be repeated in the x-axis with the gate structures (word lines) coupling any number of separate transistor structures.

Figure 2B:
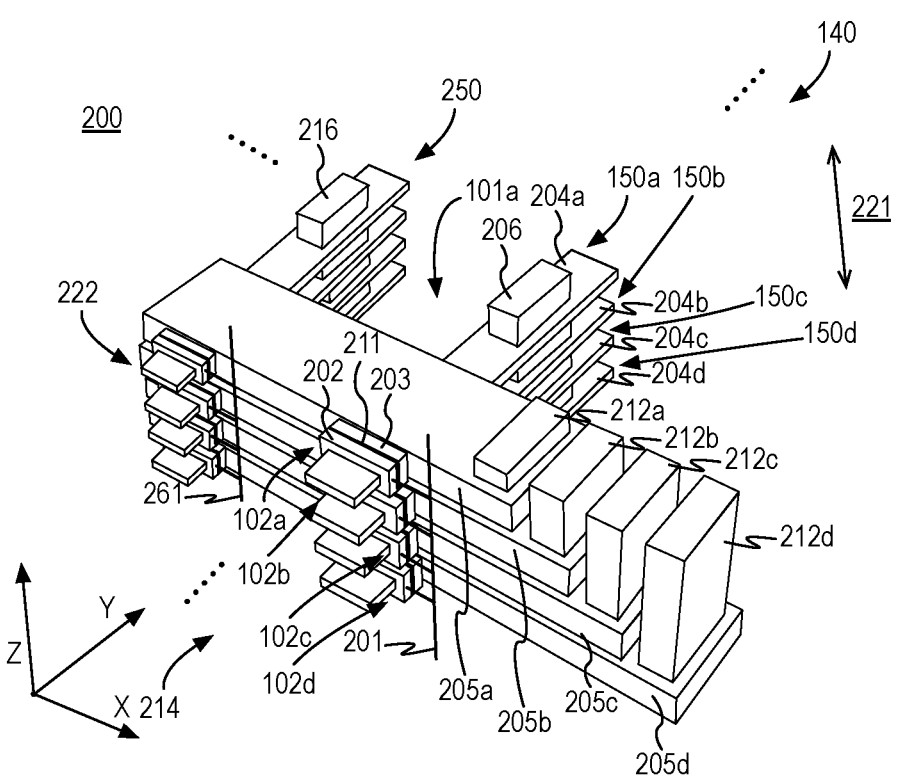
FIG. 2B illustrates an isometric view of the example 3D dynamic random access memory device of FIG. 2A.

FIG. 2B illustrates an isometric view of example 3D dynamic random access memory device 200 including a portion of one transistor-one capacitor array 140, arranged in accordance with at least some implementations of the present disclosure. In FIG. 2B, an exemplary implementation is shown that may be deployed in an IC die, for example. As discussed with respect to FIG. 2A, 1T-1C cell 150a includes transistor 101a including semiconductor structure 204a, gate structure 205a that provides one of word lines 106, and a source and drain (not labeled), and capacitor 102a. One of the source or drain is coupled to an inner capacitor plate 203 of capacitor 102a. Capacitor 102a further includes a capacitor dielectric 211 and outer capacitor plate 202. The other of the source and drain is coupled to bit line contact 206. The spacing between gate structure 205a and bit line contact 206 may be exaggerated herein for the sake of clarity. In practice the spacing may be in the range of 2 to 5 nm. In a similar manner, another 1T-1C cell 150b includes semiconductor structure 204b, gate structure 205b that provides another one of word lines 106, and a source and drain, and capacitor 102b. One of the source or drain is coupled to an inner plate of capacitor 102b, which also includes a capacitor dielectric and outer plate. The other of the source and drain of transistor 101b is coupled to shared bit line contact 206. Analogously, additional 1T-1C cells 150c, d include transistors 101c, d, which are controlled by gate structures 205c, d, as well as capacitors 102c, d, respectively.

As shown, 3D DRAM device 200 includes vertically aligned semiconductor structures 204a-d, gate structures 205a-d, each of gate structure 205a-d coupled to a corresponding one of the semiconductor structures 204a-d, vertically aligned capacitors 102a-d, each of capacitors 102a-d coupled to a corresponding one of the semiconductor structures 204a-d and laterally aligned with a corresponding one of the gate structures 205a-d, and bit line contact 206 extending vertically across depth 221 of semiconductor structures 204a-d, such that bit line contact 206 is coupled to each of semiconductor structures 204a-d. As used herein the term laterally aligned is used in a similar manner to vertically aligned, but in the x-y plane. As shown, each of gate structures 205a-d (i.e., word lines) are contacted by a word line contact 212a-d. Each of outer capacitor plate 202 are coupled to shared capacitor contact 201 which may be a via metallization or the like.

The structure of the portion of 1T-1C array 140 illustrated is repeated in the y-axis such that 1T-1C array 140 includes shared capacitor contact 201; vertically aligned capacitors 102a-d; transistors 101a-d (with only 101a being labeled for the sake of clarity) having channels surrounded by independent gate structures 205a-d (i.e., word lines), sources or drains terminating at capacitors 102a-d, another of the sources or drains terminating at shared bit line contact 206; shared bit line contact 206; another shared capacitor contact (not shown); another number of vertically aligned capacitors (not shown); another number of corresponding transistors (not shown) having the same features; and a shared bit line (not shown), and so on.

Furthermore, the structure of the portion of 1T-1C array 140 is also repeated in the x-axis as shown with respect to shared capacitor contact 201, vertically aligned capacitors 102a-d, transistors 101a-d having independent gate structures 205a-d (i.e., word lines), and shared bit line 206 being substantially repeated with respect to shared capacitor contact 261, vertically aligned capacitors 222, gate structures 205a-d (i.e., shared word lines), shared bit line 216, and so on. Notably, bit line 216 provides coupling in the z-direction and gate structures 205a-d (i.e., word lines) provide coupling in the orthogonal-direction to provide the orthogonal nature of 1T-1C array 140. Although illustrated with respect to gate structures 205a-d connecting two sets of 1T-1C cell 150, 250, gate structures 205a-d may connect any number of 1T-1C cells.

Each of capacitors 102a-d includes inner capacitor plate 203, capacitor dielectric 211, and outer capacitor plate 202. The term inner plate indicates the plate in contact with a semiconductor structure and the term outer plate indicates the plate opposite the semiconductor structure from the inner plate. As shown, in some embodiments, each inner capacitor plate 203 is laterally adjacent to one of semiconductor structures 204a-d, capacitor dielectric 211 is laterally adjacent to inner capacitor plate 203, and outer capacitor plate 202 is laterally adjacent to capacitor dielectric 211. Capacitor plates 202, 203 may be any suitable metal such as copper. Capacitor dielectric 211 may be a single layer or multilayer dielectric including any suitable dielectric material(s) such as titanium oxide, zirconium oxide, aluminum oxide, hafnium oxide, silicon carbide, gallium nitride, silicon oxide, strontium titanate, barium titanate, strontium barium titanate, tantalum oxide, or combinations thereof optionally doped with oxygen or nitrogen. Other material systems inclusive of ferroelectric capacitor materials may be used.

Furthermore, as shown, in some embodiments, bit line contact 206 extends through semiconductor structures 204a-d and is within the x-y footprint of semiconductor structures 204a-d. In some embodiments, bit line contact 206 is aligned with an outer edge of semiconductor structures 204a-d or extends beyond the outer edge of semiconductor structures 204a-d.

Figure 3A:
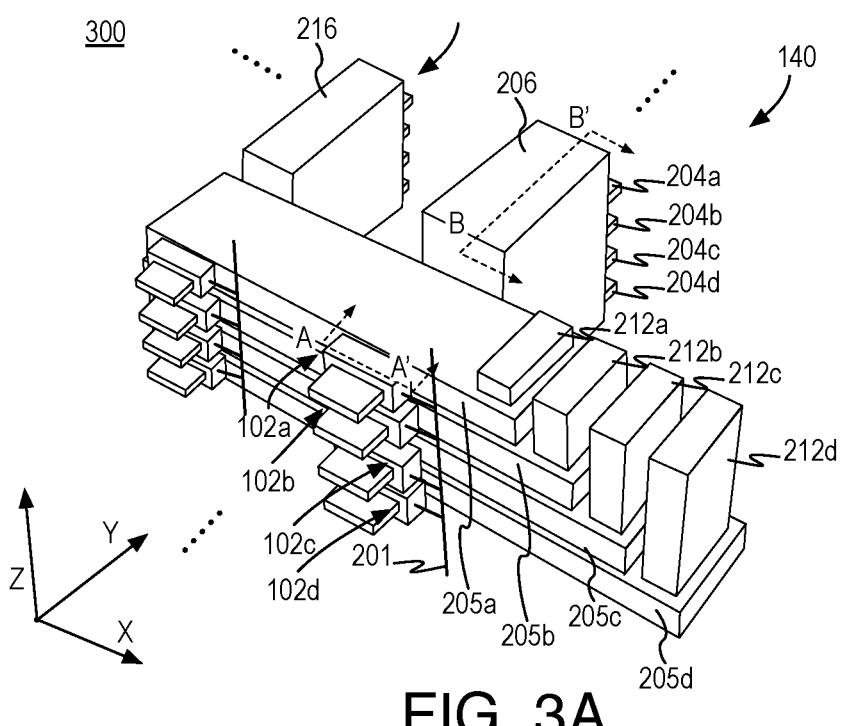
FIG. 3A illustrates a cross-sectional view of another example 3D dynamic random access memory device including a portion of a one transistor-one capacitor array.

FIG. 3A illustrates a cross-sectional view of another example 3D dynamic random access memory device 300 including a portion of one transistor-one capacitor array 140, arranged in accordance with at least some implementations of the present disclosure. In FIG. 3A, alternative capacitor and bit line contact embodiments are shown. Such capacitor and bit line contact embodiments may be deployed (together or separately) in any 3D DRAM device discussed herein.

Figure 3B:
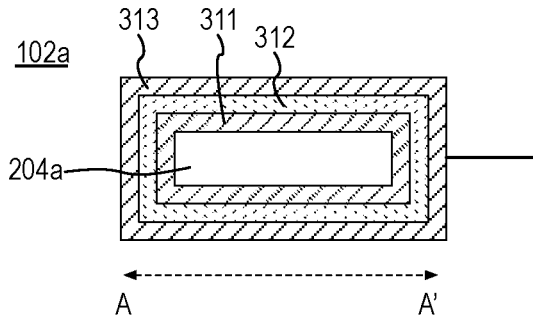
FIG. 3B illustrates a cross-sectional view of an example capacitor.

For example, in some embodiments, vertically aligned capacitors 102a-d are wrap around capacitors. In FIG. 3A, a cross-section A-A' is taken in the x-z plane across capacitor 102a. FIG. 3B illustrates a cross-sectional view of example capacitor 102a, arranged in accordance with at least some implementations of the present disclosure. As shown in FIG. 3B, in some embodiments, any or all of capacitors 102a-d include a wraparound structure such that an inner capacitor plate 311 surrounds and is in contact with a portion of semiconductor channel structure 204a, a capacitor dielectric 312 surrounds and is in contact with inner capacitor plate 311, and an outer capacitor plate 313 surrounds and is in contact with capacitor dielectric 312. Inner capacitor plate 311, capacitor dielectric 312, and outer capacitor plate 313 may have any characteristics discussed herein with respect to capacitor plates 202, 203 and capacitor dielectric 211.

Figure 3C:
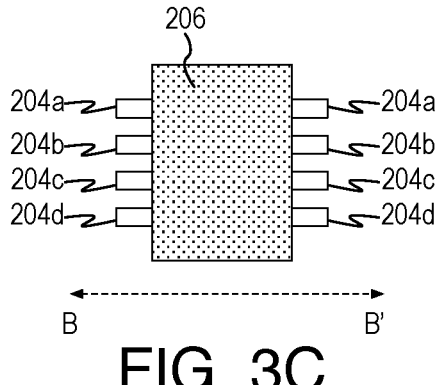
FIG. 3C illustrates a cross-sectional view of an example bit line contact and example semiconductor channel structures.

Returning to FIG. 3A, in addition or in the alternative, in some embodiments, bit line contact 206 is a source or drain material epitaxial to semiconductor structures 204a-d. For example, semiconductor structures 204a-d may be cut or exposed and bit line contact 206 may be grown via epitaxial growth techniques from semiconductor structures 204a-d. In some embodiments, semiconductor structures 204a-d are not cut and, instead, bit line contact 206 is grown directly from semiconductor structures 204a-d. As used herein, the term epitaxial to indicates a material having a crystal structure matching that of the underlying material. In FIG. 3A, a cross-section B-B' is taken in the y-z plane across bit line contact 206 and semiconductor channel structures 204a-d. FIG. 3C illustrates a cross-sectional view of example bit line contact 206 and semiconductor channel structures 204a-d, arranged in accordance with at least some implementations of the present disclosure. As shown in FIG. 3C, in some embodiments, bit line contact 206 is formed epitaxially from semiconductor channel structures 204a-d. For example, bit line contact 206 may be grown from the crystalline material of semiconductor channel structures 204a-d. Bit line contact 206 may include any suitable material. In some embodiments, bit line contact 206 is fabricated using a silicon alloy such as silicon germanium or silicon carbide. In some embodiments, the epitaxially deposited silicon alloy may be doped in situ with dopants such as boron, arsenic, or phosphorous. In some embodiments, bit line contact 206 may be formed using one or more alternate semiconductor materials such as germanium or a group III-V material or alloy.

Figure 4A:
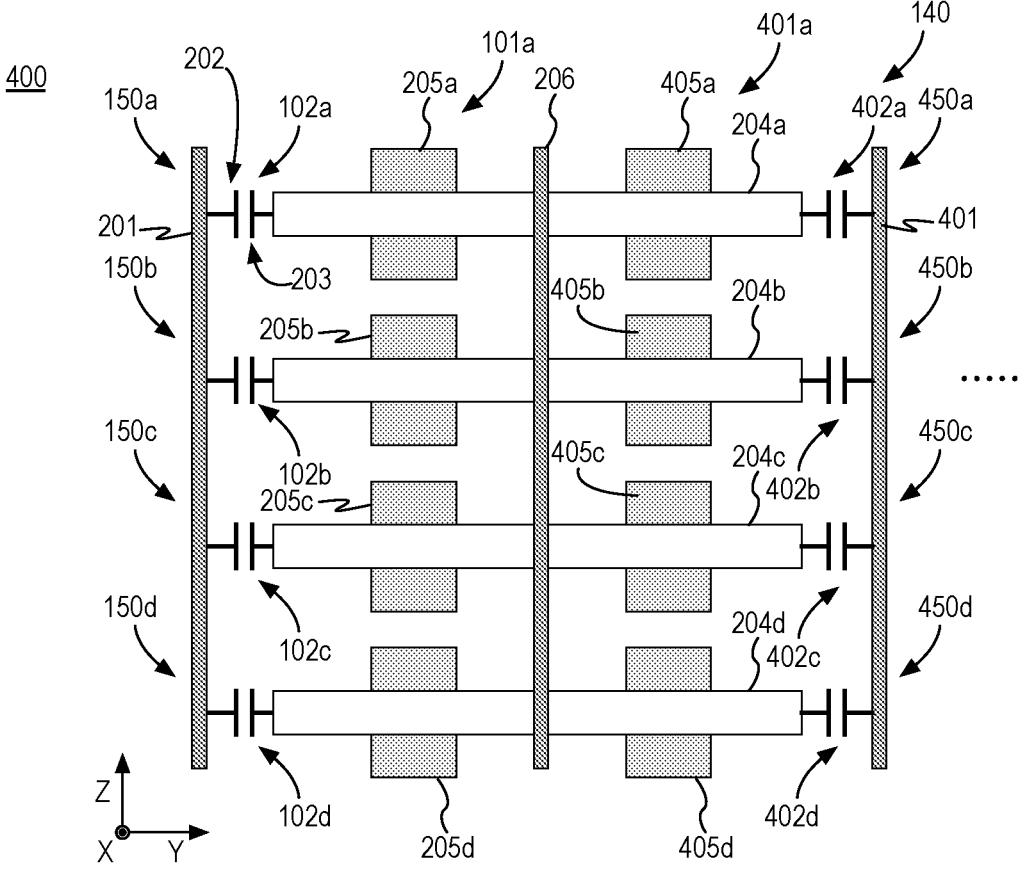
FIG. 4A illustrates a cross-sectional view of an example 3D dynamic random access memory device having shared bit line contacts.
Figure 4B:
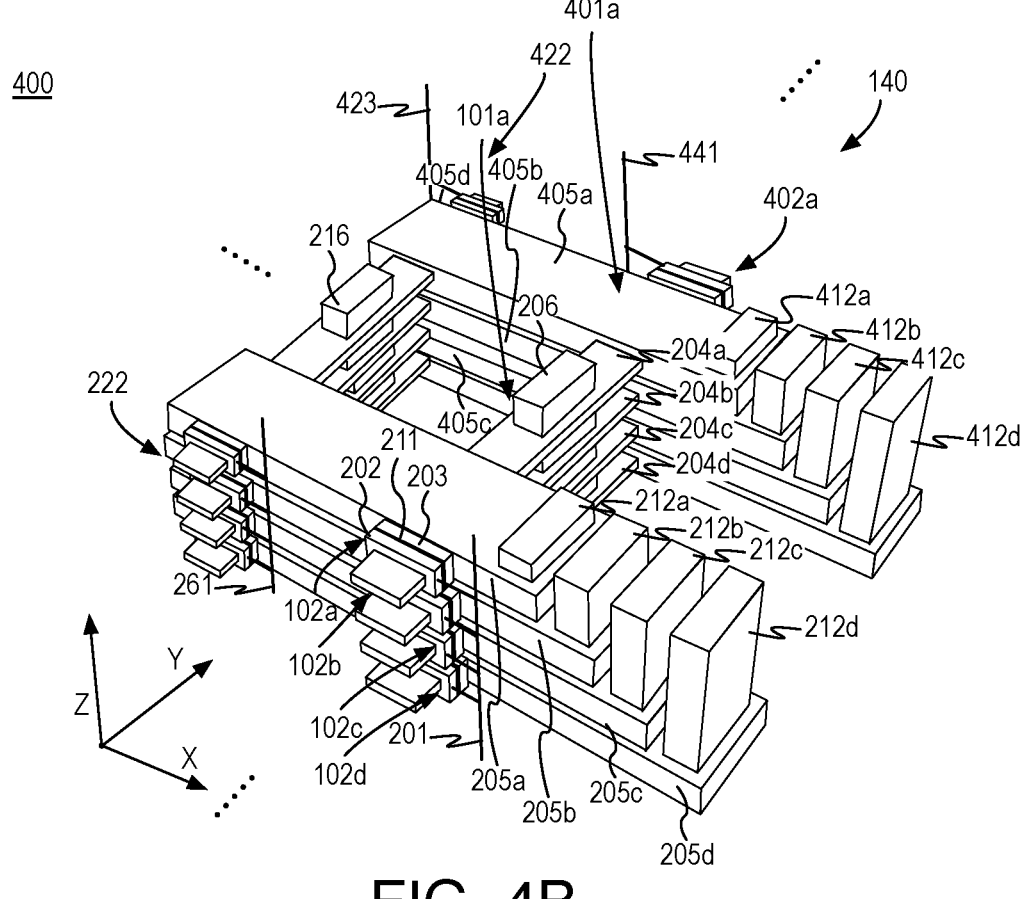
FIG. 4B illustrates an isometric view of the example 3D dynamic random access memory device of FIG. 4A.

Discussion now turns to embodiments that further compact the 3D DRAM device using shared bit lines and/or shared capacitor contacts. In FIGS. 4A and 4B, shared bit lines are deployed and in FIGS. 5A and 5B, both shared bit lines and shared capacitor contacts are used. In some embodiments, shared capacitor contacts are used and shared bit lines are not implemented. For example, one or both of shared bit lines and shared capacitor contacts may be deployed. In the following discussion, like numerals are used to indicate like structures, which may have any characteristics discussed elsewhere herein. Furthermore, similar structures, whether having the same numerals or not may share characteristics discussed elsewhere herein. For example, newly presented capacitors may be lateral plate/ dielectric/plate capacitors or wrap around capacitors, newly presented bit lines may have any characteristics discussed with respect to other bit lines, and so on.

FIG. 4A illustrates a cross-sectional view of an example 3D dynamic random access memory device 400 having shared bit line contacts, arranged in accordance with at least some implementations of the present disclosure. 1T-1C cells 150*a-d* include transistors 101*a-d* and capacitors 102*a-d* having any features discussed herein above. In a similar manner, 1T-1C cell 450*a-d* include transistors 401*a-d* (with only transistor 401*a* labeled) and capacitors 402*a-d* having any features discussed herein above. For example, transistor 101*a* includes gate structure 205 that is coupled to a channel of semiconductor structure 204*a* (or a separate channel structure), a source or drain coupled to capacitor 402*a*, and another of the source or drain coupled to shared bit line contact. Other transistors of 1T-1C cells 450*b-d* have the same or similar features. Bit line contact 206 is shared between 1T-1C cells 150*a-d* and 1T-1C cells 450*a-d*.

For example, 3D DRAM device 400 includes vertically aligned semiconductor structures 204*a-d*. Semiconductor structures 204*a-d* may extend between capacitors 102*a-d* and capacitors 402*a-d* or they may be segmented. As shown, each of semiconductor structures 204*a-d* is contacted by gate structures 205*a-d* and gate structures 405*a-d*. Each gate structure provides a separately controllable word line that extends in the x-direction. Gate structures 405*a-d* each include a gate dielectric (not shown) on a channel portion of a corresponding one of semiconductor structures 204*a-d* and a gate electrode on the gate dielectric.

As shown, bit line contact 206 of 3D DRAM device 400 is shared between 1T-1C cells 150*a-d* and 1T-1C cells 450*a-d*. In operation, when data is provided on bit line contact 206, gate structures 205*a-d* control access to capacitors 102*a-d* and gate structures 405*a-d* control access to capacitors 402*a-d*. Bit line contact 206 may be a single material component or several material components conductively coupled to form a single bit line contact 206.

The structure of the portion of 1T-1C array 140 illustrated may then be repeated in the y-axis such that 1T-1C array 140 includes a shared capacitor contact, a number of vertically aligned capacitors, a number of corresponding transistors having independent gate structures (word lines) and a shared bit line, a second number of corresponding transistors having independent gate structures (word lines) and using the same shared bit line, a second number of vertically aligned capacitors, and another shared capacitor contact 441. Furthermore, the structure of the portion of 1T-1C array 140 illustrated may also be repeated in the x-axis with the gate structures (word lines) coupling any number of separate transistor structures. The example of FIG. 4A provides further compression (in the x-y plane) of the 3D DRAM by sharing bit line contact 206.

FIG. 4B illustrates an isometric view of example 3D dynamic random access memory device 400, arranged in accordance with at least some implementations of the present disclosure. In FIG. 4B, an exemplary implementation is shown that may be deployed in an IC die, for example. As discussed with respect to FIG. 4A, 1T-1C cell 150*a* includes a transistor 101*a* including semiconductor structure 204*a*, gate structure 205*a* that provides one of word lines 106, and a source and drain (not labeled). One of the source or drain is coupled to an inner capacitor plate 203 of capacitor 102*a*. Capacitor 102*a* further includes a capacitor dielectric 211 and outer capacitor plate 202. The other of the source and drain is coupled to bit line contact 206.

As shown, 3D DRAM device 400 includes vertically aligned semiconductor structures 204*a-d*, independent gate structures 205*a-d*, each of gate structure 205*a-d* coupled to a corresponding one of the semiconductor structures 204*a-d*, vertically aligned capacitors 102*a-d*, each of capacitors 102*a-d* coupled to a corresponding one of the semiconductor structures 204*a-d* and laterally aligned with a corresponding one of the gate structures 205*a-d*, and bit line contact 206 extending vertically across depth 221 of semiconductor structures 204*a-d*, such that bit line contact 206 is coupled to each of semiconductor structures 204*a-d*. In 3D DRAM device 400, gate structures 205*a-d* are laterally between capacitors 102*a-d* and bit line contact 206. 3D DRAM device 400 further includes a number of second independent gate structures 405*a-d*, each coupled to a corresponding one of semiconductor structures 204*a-d*, and a number of second vertically aligned capacitors 402*a-d* (with capacitors 402*b-d* obscured in FIG. 4B), each of capacitors 402*a-d* coupled to a corresponding one of semiconductor structures 204*a-d* and laterally aligned with a corresponding one of gate structures 405*a-d*, such that bit line contact 206 is shared to provide access to capacitors 102*a-d* and second capacitors 402*a-d*.

The structure of the portion of 1T-1C array 140 illustrated is repeated in the y-axis such that 1T-1C array 140 includes shared capacitor contact 201; vertically aligned capacitors 102*a-d*; transistors 101*a-d* (with only 101*a* being labeled for the sake of clarity) having channels surrounded by independent gate structures 205*a-d* (i.e., word lines), sources or drains terminating at capacitors 102*a-d*, another of the sources or drains terminating at shared bit line contact 206; shared bit line contact 206; sources or drains of transistors 401*a-d* (with only transistor 401*a* being labeled for the sake of clarity) terminating at shared bit line contact 206 such that transistors 401*a-d* have channels surrounded by independent gate structures 405*a-d* (i.e., word lines), another of the sources or drains coupled to vertically aligned capacitors 402*a-d*; shared capacitor contact 441; another shared capacitor contact; and so on. As shown, each of gate structures 405*a-d* (i.e., word lines) are contacted by a word line contact 412*a-d*.

Furthermore, the structure of the portion of 1T-1C array 140 is also repeated in the x-axis as shown with respect to shared capacitor contact 201, vertically aligned capacitors 102*a-d*, transistors 101*a-d* having independent gate structures 205*a-d* (i.e., word lines), shared bit line 206, transistors 401*a-d* having independent gate structures 405*a-d* (i.e., word lines), and vertically aligned capacitors 402*a-d* being substantially repeated with respect to vertically aligned capacitors 222, gate structures 205*a-d* (i.e., word lines), shared bit line 216, structures 405*a-d* (i.e., word lines), vertically aligned capacitors 422, shared capacitor contact 423, and so on. Notably, bit line 216 provides coupling in the z-direction and gate structures 205*a-d* (i.e., word lines) provide coupling in the orthogonal z-direction to provide the orthogonal nature of 1T-1C array 140. Although illustrated with respect to gate structures 205*a-d* connecting two sets of 1T-1C cell 150, 250, gate structures 205*a-d* may connect any number of 1T-1C cells.

Figure 5A:
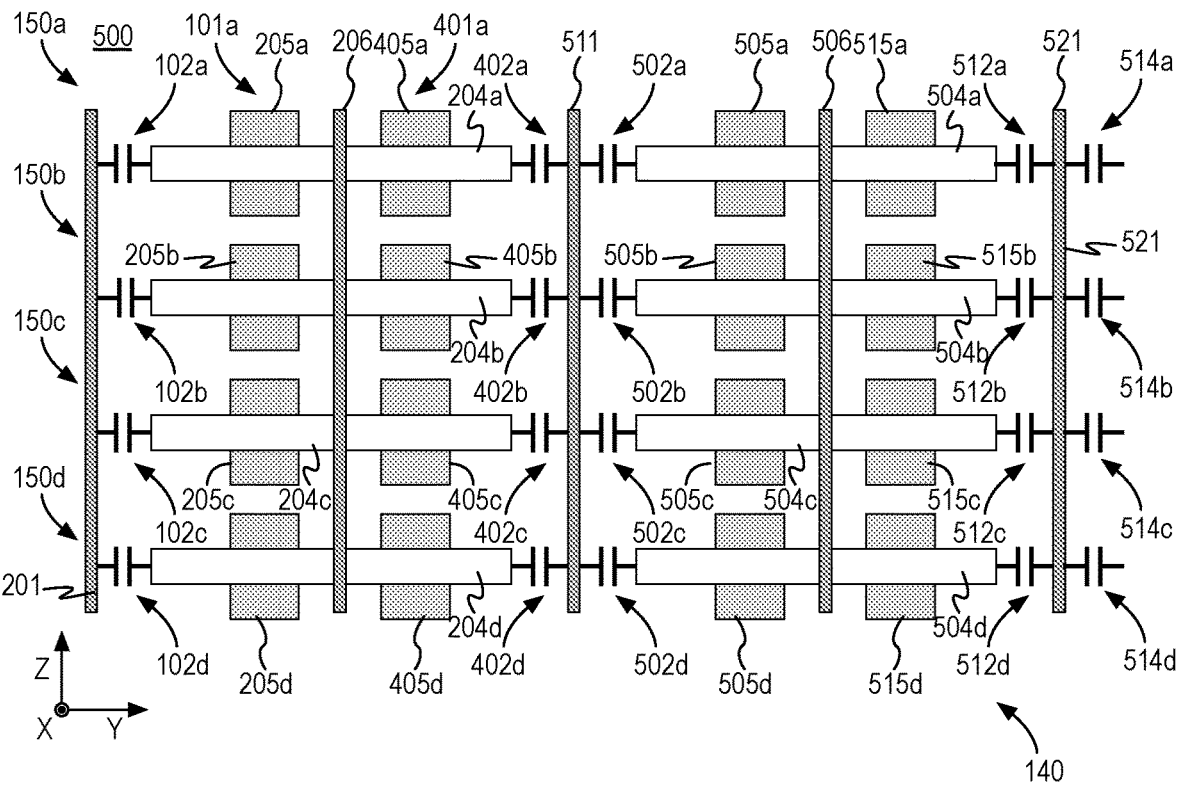
FIG. 5A illustrates a cross-sectional view of an example 3D dynamic random access memory device having shared bit line contacts and shared capacitor contacts.

FIG. 5A illustrates a cross-sectional view of an example 3D dynamic random access memory device 500 having shared bit line contacts and shared capacitor contacts, arranged in accordance with at least some implementations of the present disclosure. 1T-1C cells 150*a-d* include transistors 101*a-d* and capacitors 102*a-d*, and 1T-1C cell 450*a-d* include transistors 401*a-d* and capacitors 402*a-d* having any features discussed herein above. As discussed, bit line contact 206 is shared between 1T-1C cells 150*a-d* and 1T-1C cells 450*a-d*.

Furthermore, outer plates of capacitors 402a-d and capacitors 502a-d are coupled to a shared capacitor contact 511. Shared capacitor contact 511 extends vertically across a depth of capacitors 402a-d and capacitors 502a-d and couples to outside plates of all such capacitors 402a-d and capacitors 502a-d. The previously discussed 1T-1C cells are then substantially mirrored with inner plates of capacitors 502a-d coupled to sources or drains of semiconductor structures 504a-d, gate structures 505a-d (i.e., word lines) coupled to channels of semiconductor structures 504a-d, a shared bit line contact 506 coupled to the other of the source or drain of semiconductor structures 504a-d, sources or drains of semiconductor structures 504a-d coupled to shared bit line contact 506, gate structures 515a-d (i.e., word lines) coupled to channels of semiconductor structures 504a-d, and the other of the source or drain of semiconductor structures 504a-d coupled to outer plates of capacitors 512a-d. Capacitors 512a-d may also be coupled to a shared capacitor contact 511, which is shared with capacitors 514a-d, and so on with the patterning repeating with additional semiconductor structures 504a-d and corresponding components. Furthermore, the structure of the portion of 1T-1C array 140 illustrated may also be repeated in the x-axis as discussed herein.

Figures 5B, 5C:
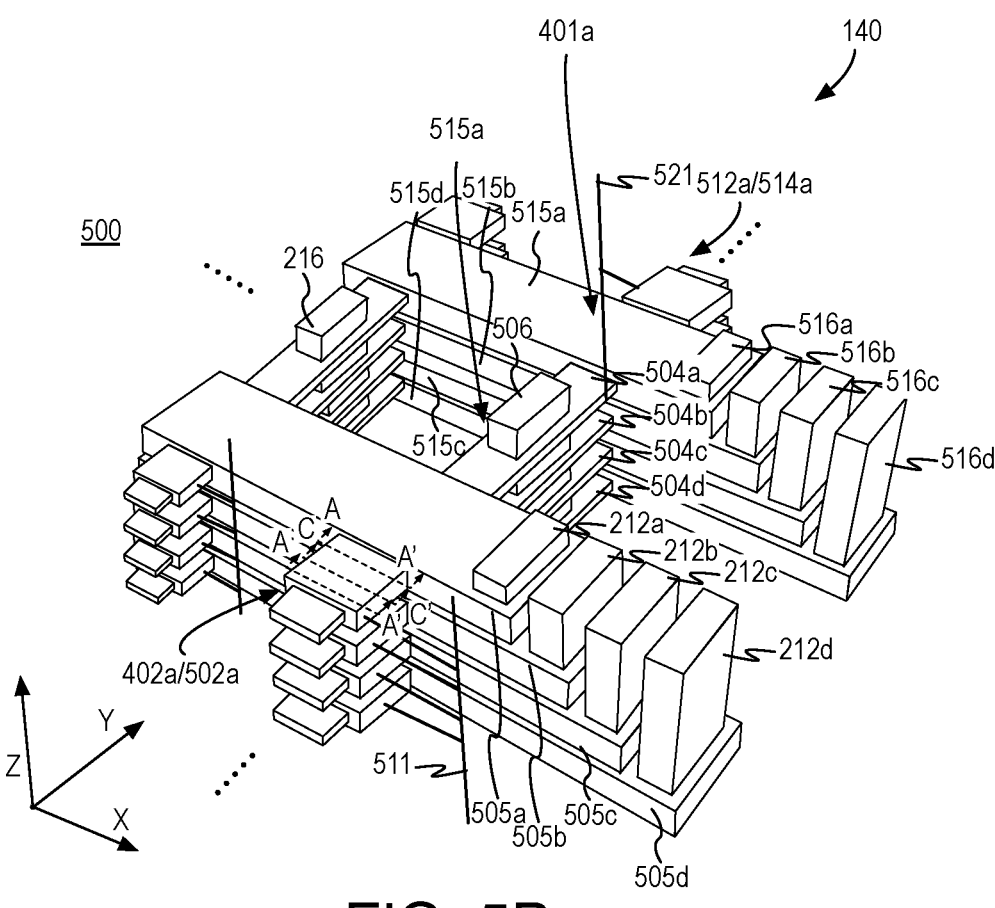
FIG. 5B illustrates an isometric view of the example 3D dynamic random access memory device of FIG. 5A.
FIG. 5C illustrates a cross-sectional view between example capacitors that share a capacitor contact.

FIG. 5B illustrates an isometric view of example 3D dynamic random access memory device 500, arranged in accordance with at least some implementations of the present disclosure. As discussed with respect to FIG. 5A, shared capacitor contact 511 is shared between outer plates of capacitors 402a-d and capacitors 502a-d.

In FIG. 5B, cross-sections taken at both A-A' locations (i.e., taken in the x-z plane across capacitors 402a/502a) result in the view illustrated herein with respect to FIG. 3B. Notably, the outer plates of capacitors 402a/502a are shared and the inner plates of capacitors 402a/502a are separate or independent.

For example, in FIG. 5B, another cross-section is taken at C-C' in the x-z plane across a region between capacitors 402a/502a. FIG. 5C illustrates a cross-sectional view between example capacitors 402a/502a that share capacitor contact 511, arranged in accordance with at least some implementations of the present disclosure. As shown in FIG. 5C, in some embodiments, outer capacitor plate 313 is shared between capacitors 402a/502a. Furthermore, outer capacitor plate 313 is in contact with capacitor contact 511. Thereby, capacitors 402a/502a are both coupled to capacitor contact 511, which may be connected to a ground rail, for example. Inner capacitor plates of capacitors 402a/502a and related semiconductor structures are separated by dielectric material 555 as shown in FIG. 5C (please refer also to FIG. 3B) such that capacitors 402a/502a are independently accessible or controllable.

1T-1C cell 150a includes a transistor 101a including semiconductor structure 204a, gate structure 205a that provides one of word lines 106, and a source and drain (not labeled). One of the source or drain is coupled to an inner capacitor plate 203 of capacitor 102a. Capacitor 102a further includes a capacitor dielectric 211 and outer capacitor plate 202. The other of the source and drain is coupled to bit line contact 206.

As shown, 3D DRAM device 400 includes vertically aligned semiconductor structures 204a-d, independent gate structures 205a-d, each of gate structure 205a-d coupled to a corresponding one of the semiconductor structures 204a-d, vertically aligned capacitors 102a-d, each of capacitors 102a-d coupled to a corresponding one of the semiconductor structures 204a-d and laterally aligned with a corresponding one of the gate structures 205a-d, and bit line contact 206 extending vertically across depth 221 of semiconductor structures 204a-d, such that bit line contact 206 is coupled to each of semiconductor structures 204a-d. In 3D DRAM device 400, gate structures 205a-d are laterally between capacitors 102a-d and bit line contact 206. 3D DRAM device 400 further includes a number of second independent gate structures 405a-d, each coupled to a corresponding one of semiconductor structures 204a-d, and a number of second vertically aligned capacitors 402a-d (with capacitors 402b-d obscured in FIG. 4B), each of capacitors 402a-d coupled to a corresponding one of semiconductor structures 204a-d and laterally aligned with a corresponding one of gate structures 405a-d, such that bit line contact 206 is shared to provide access to capacitors 102a-d and second capacitors 402a-d.

The structure of the portion of 1T-1C array 140 illustrated is repeated in the y-axis such that 1T-1C array 140 includes shared capacitor contact 201; vertically aligned capacitors 102a-d; transistors 101a-d (with only 101a being labeled for the sake of clarity) having channels surrounded by independent gate structures 205a-d (i.e., word lines), sources or drains terminating at capacitors 102a-d, another of the sources or drains terminating at shared bit line contact 206; shared bit line contact 206; sources or drains of transistors 401a-d (with only transistor 401a being labeled for the sake of clarity) terminating at shared bit line contact 206 such that transistors 401a-d have channels surrounded by independent gate structures 405a-d (i.e., word lines), another of the sources or drains coupled to vertically aligned capacitors 402a-d; shared capacitor contact 441; another shared capacitor contact; and so on. As shown, each of gate structures 405a-d (i.e., word lines) are contacted by a word line contact 412a-d.

Furthermore, the structure of the portion of 1T-1C array 140 is also repeated in the x-axis as shown with respect to shared capacitor contact 201, vertically aligned capacitors 102a-d, transistors 101a-d having independent gate structures 205a-d (i.e., word lines), shared bit line 206, transistors 401a-d having independent gate structures 405a-d (i.e., word lines), and vertically aligned capacitors 402a-d being substantially repeated with respect to vertically aligned capacitors 222, gate structures 205a-d (i.e., word lines), shared bit line 216, structures 405a-d (i.e., word lines), vertically aligned capacitors 422, shared capacitor contact 423, and so on. Notably, bit line 216 provides coupling in the z-direction and gate structures 205a-d (i.e., word lines) provide coupling in the orthogonal z-direction to provide the orthogonal nature of 1T-1C array 140. Although illustrated with respect to gate structures 205a-d connecting two sets of 1T-1C cell 150, 250, gate structures 205a-d may connect any number of 1T-1C cells.

3D DRAM device 500 includes vertically aligned semiconductor structures 504a-d, independent gate structures 505a-d and independent gate structures 515a-d separated by shared bit line contact 506. Gate structures 505a-d (i.e., word lines) control access to capacitors 502a-d and gate structures 515a-d (i.e., word lines) control access to capacitors 512a-d. Furthermore, capacitors 502a-d are immediately adjacent to and share capacitor contact 511 with capacitors 402a-d. Capacitors 402a-d are controlled by gate structures 405a-d, which are not shown in the view of FIG. 5B. Similarly, capacitors 512a-d are immediately adjacent to and share capacitor contact 521 with gate structures 515a-d. Capacitors 402a-d are controlled by gate structures not shown in the view of FIG. 5B.

The structure of the portion of 1T-1C array 140 illustrated is repeated in the y-axis and the x-axis as discussed herein with both shared bit line contact 506 and shared capacitor contacts 511, 521, as discussed herein with respect to FIGS. 2A, 2B, 4A, and 4B.

Discussion now turns to incorporation of 3D DRAM into integrated circuit systems.

Figure 6:
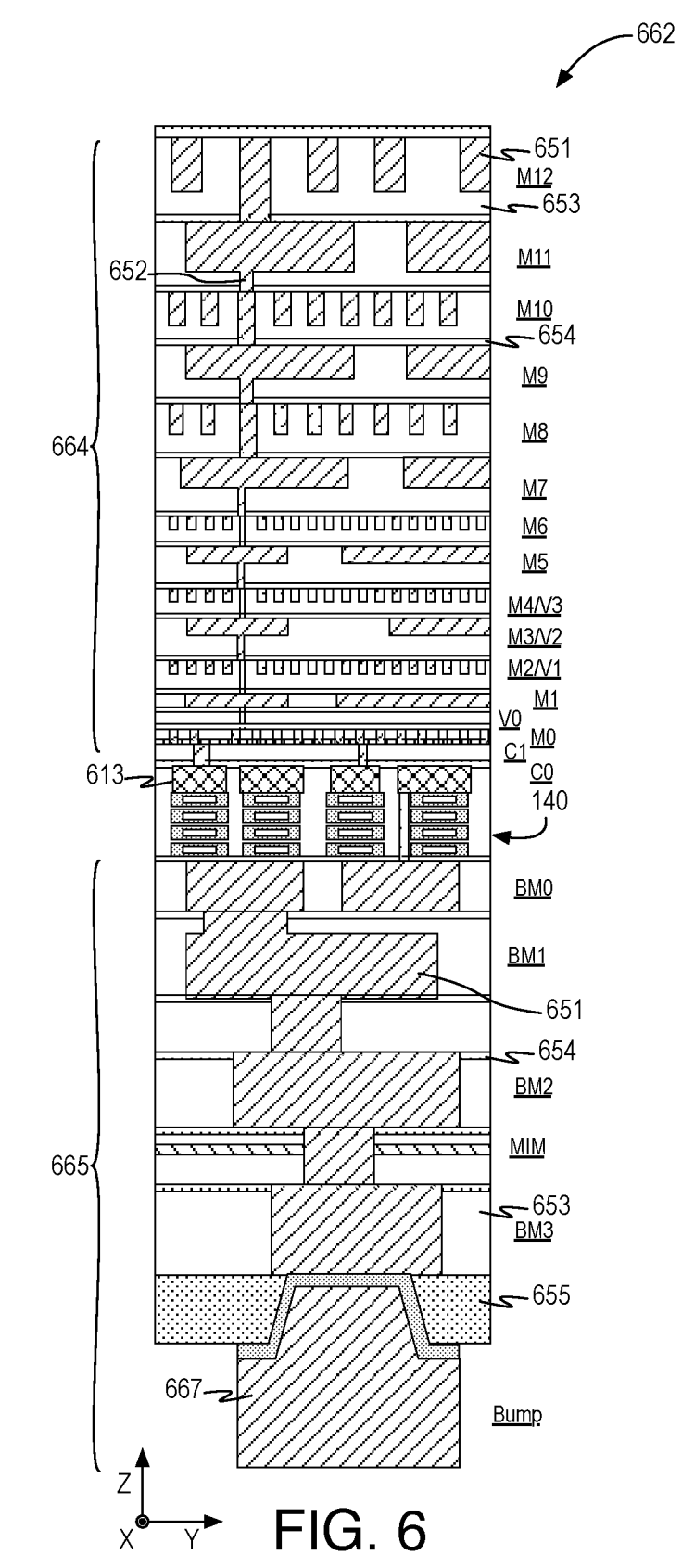
FIG. 6 illustrates a cross-sectional view of an example integrated circuit die including a 1T-1C array in accordance with any 3D dynamic random access memory device discussed herein.

FIG. 6 illustrates a cross-sectional view of an example integrated circuit die including a 1T-1C array in accordance with any 3D dynamic random access memory device discussed herein, arranged in accordance with at least some implementations of the present disclosure. As shown, a 3D DRAM system 600 includes 1T-1C array 140 in accordance with any 1T-1C array discussed herein. In FIG. 6A, a view across gate structure to semiconductor structure coupling (i.e., in the y-z plane) is shown. As shown, 3D DRAM system 600 includes front-side metallization layers 664 (or front-side interconnect layers) and optional back-side metallization layers 665 (or back-side interconnect layers) to form an integrated circuit (IC) die 662. Front-side metallization layers 664 may be formed using any suitable technique or techniques such as dual damascene techniques, single damascene techniques, subtractive metallization patterning techniques, or the like. Similarly, back-side metallization layers 665 may be formed using any suitable technique or techniques. In some embodiments, after front-side processing, the front-side of the wafer is attached to a carrier substrate and back-side removal processing (e.g., back-side grind or etch) is used to thin the wafer. Back-side metallization layers 665 are then formed using dual damascene, single damascene, subtractive metallization patterning, etc. 1T-1C array 140 may from the front-side using through via contacts 613 and/or front the back-side (not shown).

For example, interconnectivity, signal routing, and power delivery to 1T-1C array 140 is provided by front-side metallization layers 664, optional back-side metallization layers 665, and package level interconnects 667. In the illustrated example, package level interconnects 667 are provided on or over a back-side of IC die 662 as bumps over a passivation layer 655. However, package level interconnects 667 may be provided using any suitable interconnect structures such as bond pads, solder bumps, etc. Furthermore, in some embodiments, package level interconnects 667 are provided on or over a front-side of IC die 662 (i.e., over front-side metallization layers 664) and a package level cooling structure is provided on or over a back-side of IC die.

As used herein, the term metallization layer indicates metal interconnections or wires that provide electrical routing. Adjacent metallization layers, such as metallization interconnects 651, are interconnected by vias, such as vias 652, that may be characterized as part of the metallization layers or between the metallization layers. In the illustrated example, front-side metallization layers 664 include M0, V0, M1, M2/V1, M3/V2, M4/V3, and M4-M12. However, front-side metallization layers 664 may include any number of metallization layers such as eight or more metallization layers. Similarly, back-side metallization layers 665 include BM0, BM1, BM2, and BM3. However, back-side metallization layers 665 may include any number of metallization layers such as two to five metallization layers. Front-side metallization layers 664 and back-side metallization layers 665 are embedded within dielectric materials 653, 654.

As discussed the circuits and systems of the present embodiments may advantageously be deployed at very low temperatures (i.e., at or below 0° C.). Discussion now turns to exemplary very low temperature systems.

Figure 7:
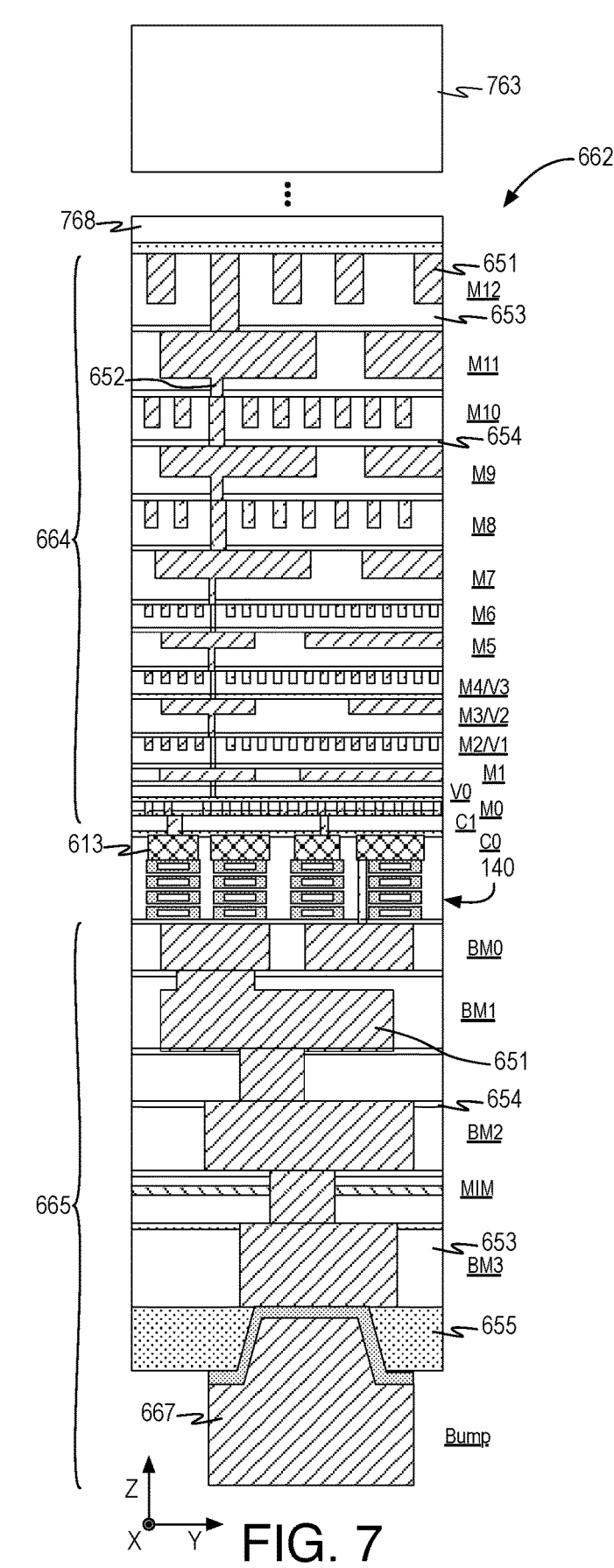
FIG. 7 illustrates a cross-sectional view of a 3D dynamic random access memory integrated circuit system for implementation at very low temperature.

FIG. 7 illustrates a cross-sectional view of a 3D dynamic random access memory integrated circuit system 700 for implementation at very low temperature, arranged in accordance with at least some implementations of the present disclosure. As shown, IC system 700 includes IC die 662, which is a monolithic integrated circuit. IC system 700 further includes a package level cooling structure 763, which may be deployed on or over front-side metallization layers 664 (as shown) or on or over a back-side of IC die 662. In some embodiments, package level cooling structure 763 is coupled to IC die 662 by an adhesion layer 768. Notably, IC system 700 may be deployed without back-side metallization layers 665.

IC system 700 includes IC die 662 and an active cooling structure operable to remove heat from IC die 662 to achieve a very low operating temperature of IC die 662. As used herein, the term very low operating temperature indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active cooling structure may be provided as a package level structure (i.e., separable from IC die 662) as shown with respect to package level cooling structure 763, as a die level structure (i.e., integral to IC die 662), or both. In some embodiments, an active cooling structure is not needed as IC die 662 is deployed in a sufficiently cold environment.

Figure 8:
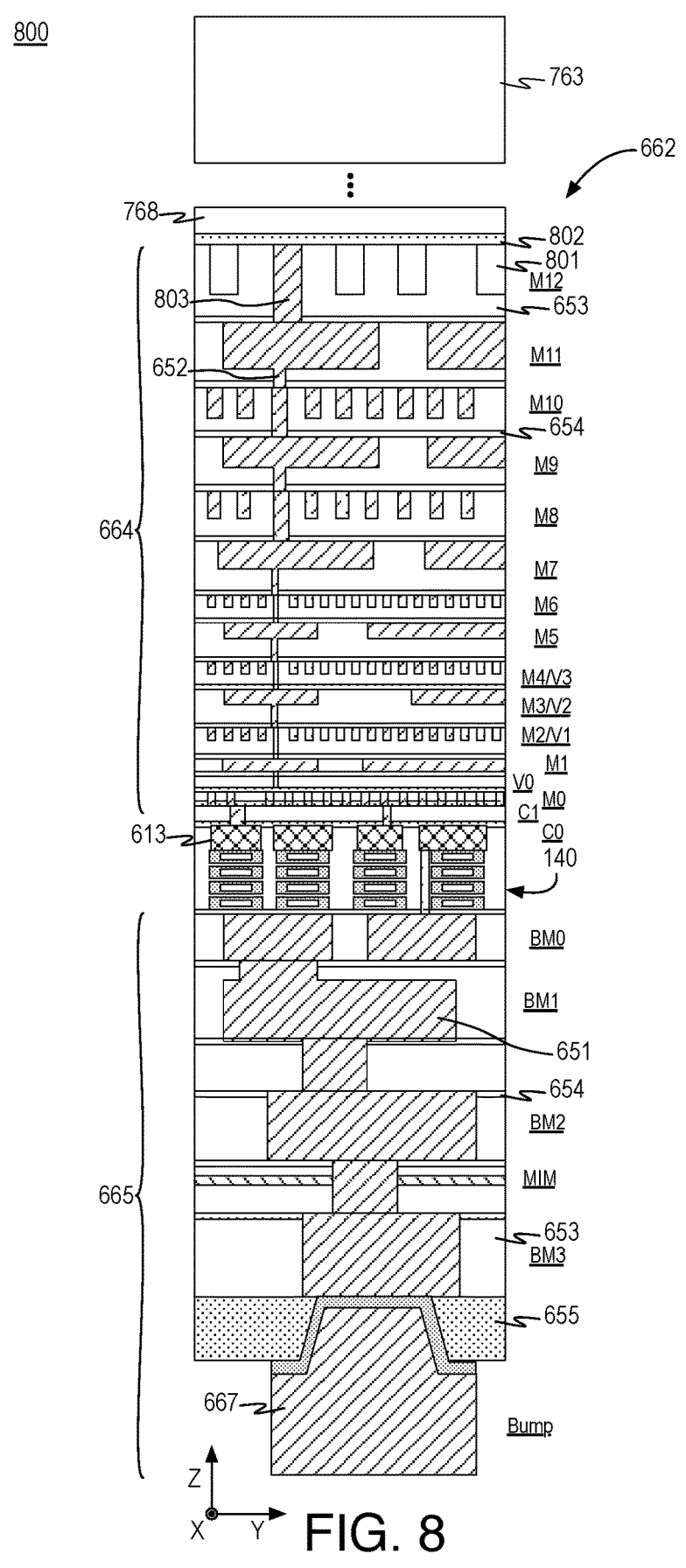

FIG. 8 illustrates a cross-sectional view of a low temperature 3D dynamic random access memory integrated circuit system 800 using die level cooling, arranged in accordance with at least some implementations of the present disclosure. In FIG. 8 and elsewhere herein, like numerals are used to indicate like structures or components that may have any characteristics discussed elsewhere herein. In the example of IC system 800, IC die 662 includes active cooling structures or components to remove heat from IC die 662 to achieve an operating temperature of IC die 662 at or below a target temperature such as 0° C. or any other operating or target temperature discussed herein.

In IC system 800, IC die 662 includes die level active cooling as provided by microchannels 801. Microchannels 801 are to convey a heat transfer fluid therein to remove heat from IC die 662. The heat transfer fluid may be any suitable liquid or gas. In some embodiments, the heat transfer fluid is liquid nitrogen operable to lower the temperature of IC die to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane. The term microchannels indicates a channel to convey a heat transfer fluid with the multiple microchannels providing discrete separate channels or a network of channels. Notably, the plural microchannels does not indicate separate channel networks are needed. Such microchannels 801 may be provided in any pattern in the x-y plane such as serpentine patterns, patterns of multiple parallel microchannels 801, or the like. Microchannels 801 couple to a heat exchanger (not shown) that removes heat from and cools the heat transfer fluid before re-introduction to microchannels 801. The flow of fluid within microchannels 801 may be provided by a pump or other fluid flow device. The operation of the heat exchanger, pump, etc. may be controlled by a controller.

In the illustrated embodiment, microchannels 801 are implemented at metallization level M12. In other embodiments, microchannels 801 are implemented over metallization level M12. Microchannels 801 may be formed using any suitable technique or techniques such as patterning and etch techniques to form the void structures of microchannels 801 and passivation or deposition techniques to form a cover structure 802 to enclose the void structures. As shown, in some embodiments, the active cooling structure of IC system 800 includes a number of microchannels 801 in IC die 662 and over a number of front-side metallization layers 664. As discussed, microchannels 801 are to convey a heat transfer fluid therein. In some embodiments, a metallization feature 803 of metallization layer M12 is laterally adjacent to microchannels 801. For example, metallization feature 803 may couple to a package level interconnect structure (not shown) for signal routing for IC die 662. In the example of IC system 800, package level cooling structure 763 may be a passive heat removal device such as a heat sink or the like. In some embodiments, package level cooling structure 763 is not deployed in IC system 800.

Figure 9:
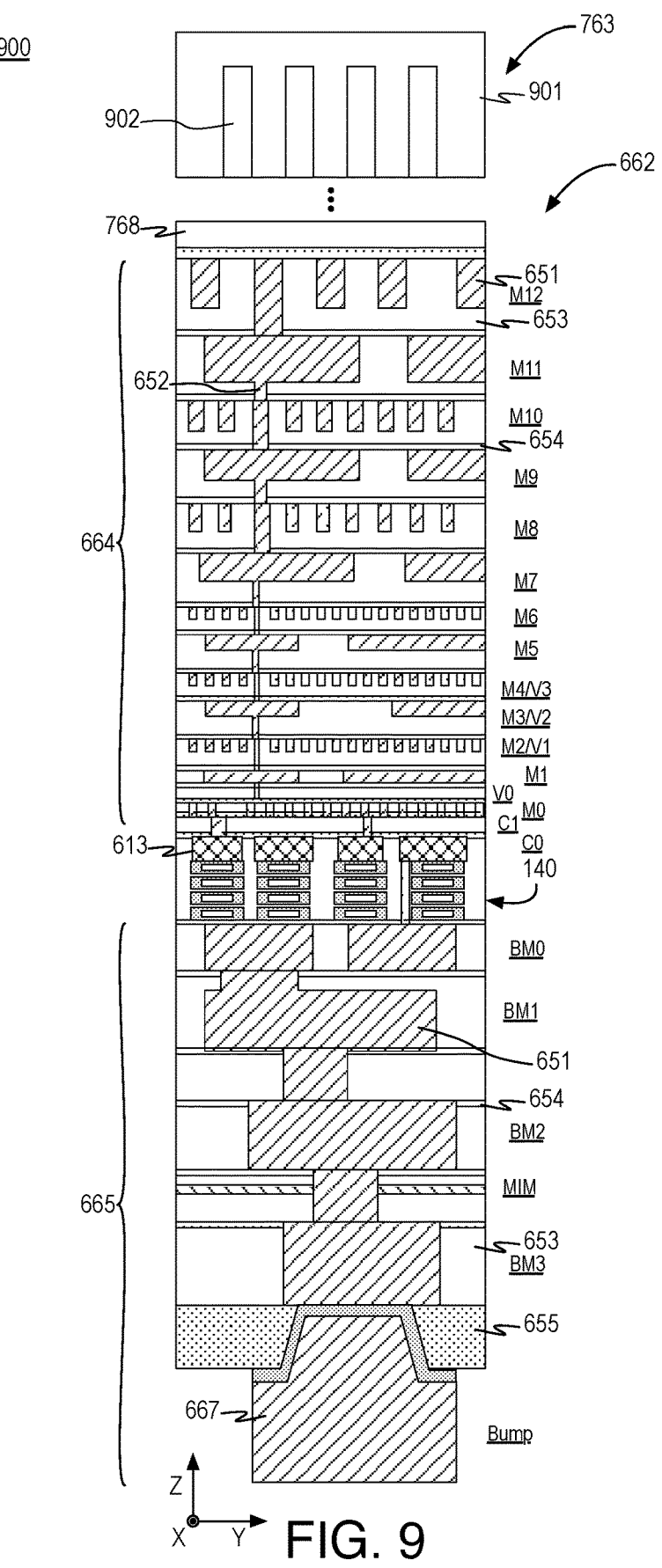
FIG. 9 illustrates a cross-sectional view of a low temperature 3D dynamic random access memory integrated circuit system using package level cooling.

FIG. 9 illustrates a cross-sectional view of a low temperature 3D dynamic random access memory integrated circuit system 900 using package level cooling, arranged in accordance with at least some implementations of the present disclosure. In the example of IC system 900, IC die 662 includes active cooling structures or components to remove heat from IC die 662 to achieve an operating temperature of IC die 662 at or below a target temperature such as 0° C. or any other operating or target temperature discussed herein.

In IC system 900, package level cooling structure 763 includes an active cooling structure 901 having microchannels 902. Microchannels 902 are to convey a heat transfer fluid therein to remove heat from IC die 662. The heat transfer fluid may be any suitable liquid or gas as discussed with respect to FIG. 8. Microchannels 902 may be provided in any pattern in the x-y plane such as serpentine patterns, patterns of multiple parallel microchannels 902, etc. Microchannels 902 couple to a heat exchanger (not shown) that removes heat from and cools the heat transfer fluid before re-introduction to microchannels 902. The flow of fluid within microchannels 902 may be provided by a pump or other fluid flow device. The operation of the heat exchanger, pump, etc. may be controlled by a controller. In the illustrated embodiment, active cooling structure 901 is a chiller mounted to IC die 662 such that the chiller has a solid body having microchannels therein to convey a heat transfer fluid.

Figure 10:
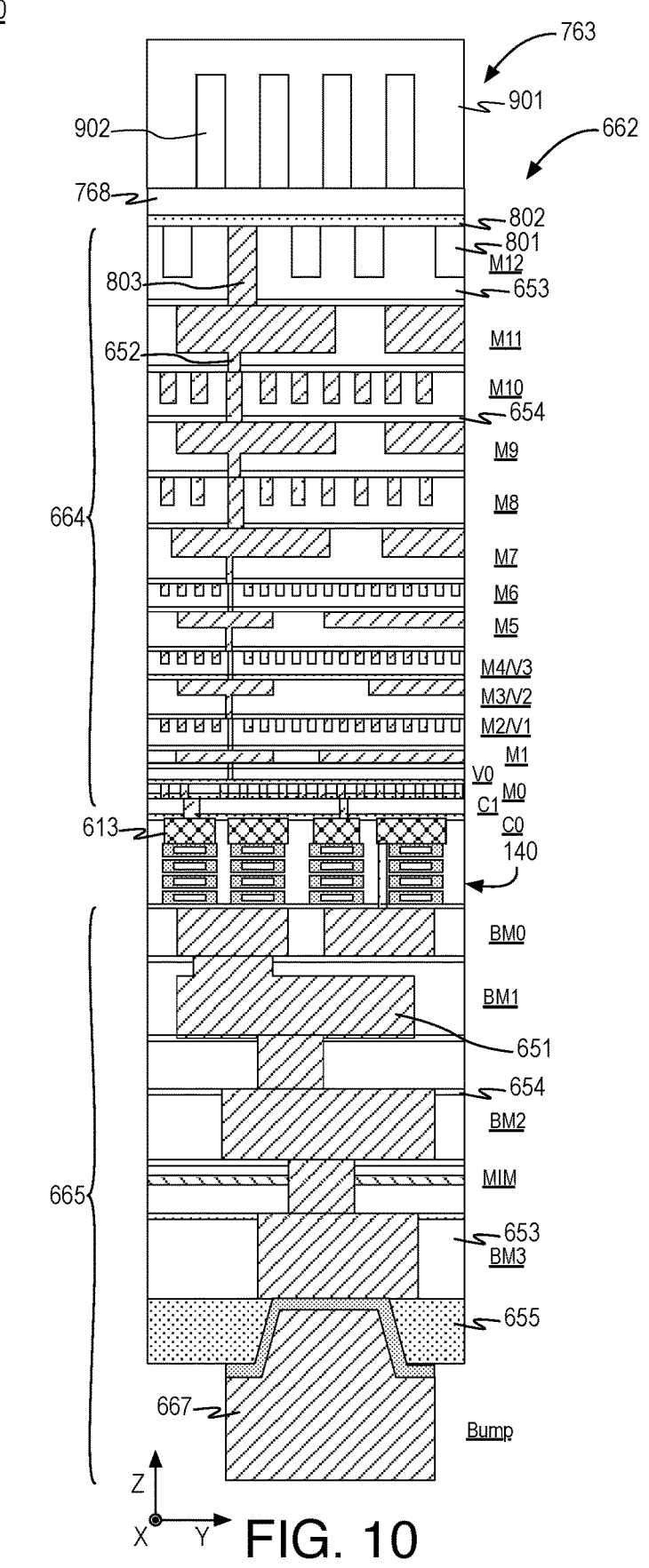
FIG. 10 illustrates a cross-sectional view of a low temperature 3D dynamic random access memory integrated circuit system using die level and package level cooling.

FIG. 10 illustrates a cross-sectional view of a low temperature 3D dynamic random access memory integrated circuit system 1000 using die level and package level cooling, arranged in accordance with at least some implementations of the present disclosure. In the example of IC system 1000, IC die 662 includes active cooling structures or components as provided by both microchannels 801 and active cooling structure 901.

In some embodiments, the heat removal fluid deployed in microchannels 801 and active cooling structure 901 are coupled to the same pump and heat exchanger systems. In such embodiments, the heat removal fluid conveyed in both microchannels 801 and active cooling structure 901 are the same material. Such embodiments may advantageously provide simplicity. In other embodiments, the heat removal fluids are controlled separately. In such embodiments, the heat removal fluids conveyed by microchannels 801 and active cooling structure 901 may be the same or they may be different. Such embodiments may advantageously provide improved flexibility.

Figure 11:
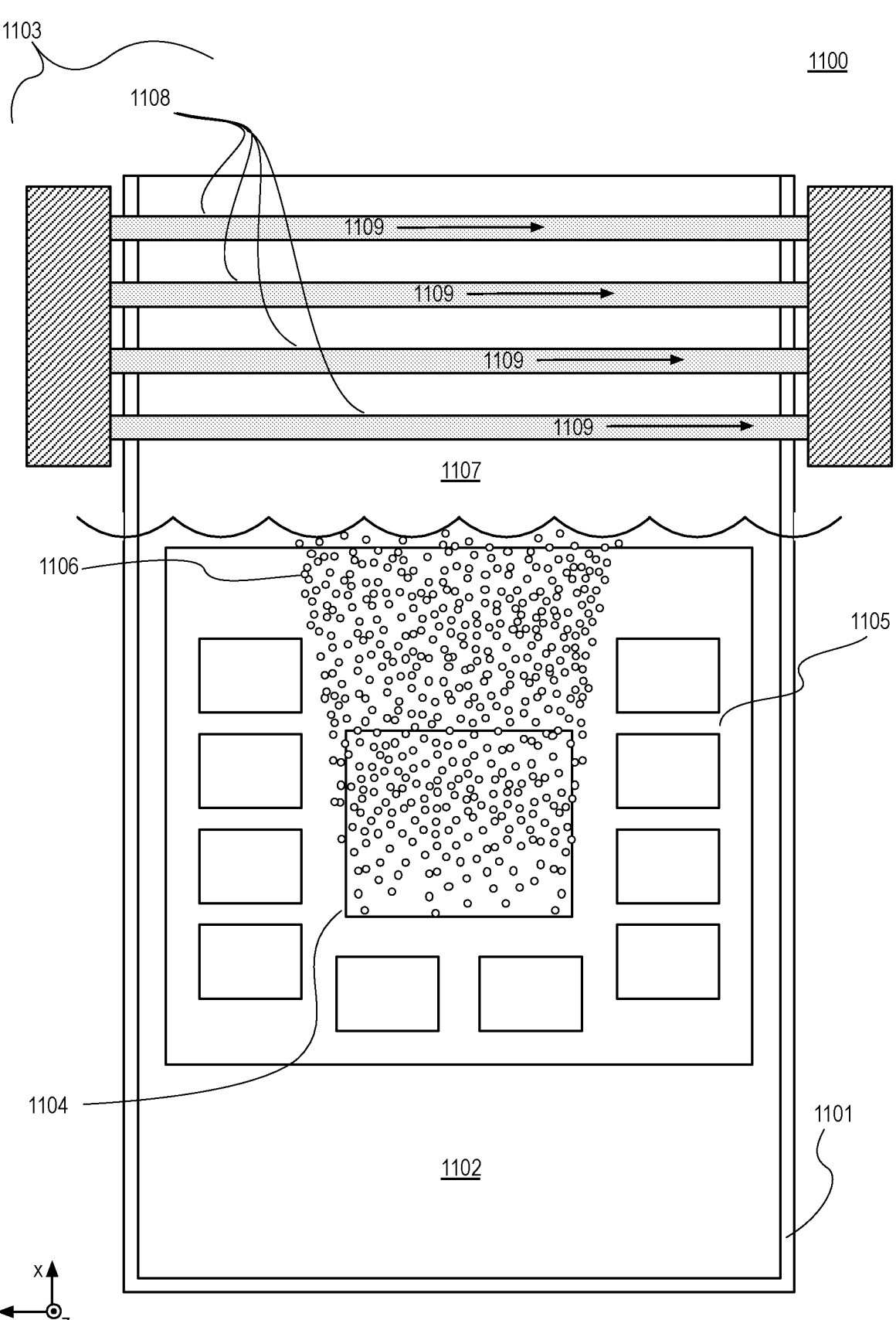
FIG. 11 illustrates a view of an example two-phase immersion cooling system for low temperature operation of an integrated circuit die having 3D dynamic random access memory.

FIG. 11 illustrates a view of an example two-phase immersion cooling system 1100 for low temperature operation of an integrated circuit die having 3D dynamic random access memory, arranged in accordance with at least some implementations of the present disclosure. As shown, two-phase immersion cooling system 1100 includes a fluid containment structure 1101, a low-boiling point liquid 1102 within fluid containment structure 1101, and a condensation structure 1103 at least partially within fluid containment structure 1101. As used herein, the term low-boiling point liquid indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 1104, such as an IC package including any of IC device as discussed herein is immersed in low-boiling point liquid 1102. In some embodiments, the IC device or system as deployed in two-phase immersion cooling system 1100 does not include additional active cooling structures, although such die level or package level active cooling structures may be used in concert with two-phase immersion cooling system 1100. In some embodiments, when deployed in two-phase immersion cooling system 1100, package level cooling structure 763 is a heat sink, a heat dissipation plate, a porous heat dissipation plate or the like.

Notably, IC die 662, deploying one or more functional circuit blocks having 3D dynamic random access memory is the source of heat in the context of two-phase immersion cooling system 1100. For example, IC die 662 may be packaged and mounted on electronics substrate 1105. Electronic substrate 1105 may be coupled to a power supply (not shown) and may be partially or completely submerged in low-boiling point liquid 1102.

In operation, the heat produced by heat generation source 1104 vaporizes low-boiling point liquid 1102 as shown in vapor or gas state as bubbles 1106, which may collect, due to gravitational forces, above low-boiling point liquid 1102 as a vapor portion 1107 within fluid containment structure 1101. Condensation structure 1103 may extend through vapor portion 1107. In some embodiments, condensation structure 1103 is a heat exchanger having a number of tubes 1108 with a cooling fluid (i.e., a fluid colder than the condensation point of vapor portion 1107) shown by arrows 1109 that may flow through tubes 1108 to condense vapor portion 1107 back to low-boiling point liquid 1102. In the IC system of FIG. 11, package level cooling structure 763 includes a passive cooling structure such as a heat sink for immersion in low-boiling point liquid 1102.

FIG. 12 is a flow diagram illustrating an example process 1200 for forming a low temperature 3D dynamic random access memory integrated circuit system, arranged in accordance with at least some implementations of the present disclosure. As shown, process 1200 begins at operation 1201, where a workpiece or substrate is received for processing. Processing continues at operation 1202, where vertically aligned semiconductor structures are formed. In some embodiments, the vertically aligned semiconductor structures are formed by providing a multilayer stack of alternating layers of semiconductor material and sacrificial material, and then etching to remove portions of the sacrificial material.

Processing continues at operation 1203, where each of the vertically aligned semiconductor structures are contacted by a separately controllable gate structure. In some embodiments, the gate structure includes a gate dielectric on the semiconductor structures and a separate gate metal on the gate dielectric of each of the semiconductor structures. The gate structures may be formed using any suitable technique or techniques such as deposition, patterning, and etch techniques.

Processing continues at operation 1204, where vertically aligned capacitors are formed such that each of the capacitors is coupled to one of the semiconductor structures. In some embodiments, each capacitor includes an inner plate on one of the semiconductor structures, a capacitor dielectric on the inner plate, and an outer plate on the capacitor dielectric. The vertically aligned capacitors may be formed using any suitable technique or techniques such as deposition, patterning, and etch techniques.

Processing continues at operation 1205, where all of the vertically aligned semiconductor structures are contacted by a bit line contact that extends across a depth of the semiconductor structures. As discussed herein, the gate structures formed at operation 1203 provide word lines that couple an array of transistors by their control gates in the x-y plane. Furthermore, the vertically aligned capacitors formed at operation 1204 are coupled to a source or drain of the array of transistors. The bit line contact couples an array of transistors orthogonal to the word lines in the z-dimension orthogonal to the x-y plane. The bit line contact may be formed using any suitable technique or techniques such as deposition, patterning, and etch techniques.

Processing continues at operation 1206, where outside plates of the capacitors formed at operation 1204 are optionally coupled to a shared capacitor contact. The capacitor contact may be formed using any suitable technique or techniques such as deposition, patterning, and etch techniques. Such operations 1201-1206 may be used to fabricate any 3D DRAM device discussed herein such as 3D DRAM device 200, 300, or 400.

Processing continues at operation 1207, where a number of metallization layers are formed over a front-side and/or a back-side of the 3D DRAM device. The front-side metallization layers and back-side metallization may be formed using any suitable technique or techniques such as dual damascene techniques, single damascene techniques, subtractive metallization patterning techniques, or the like. In some embodiments, front- or back-side metallization processing may include supporting the workpiece using a carrier wafer.

Processing continues at operation 1208, where an active cooling structure is optionally provided such that the active cooling structure is operable to remove heat from an IC die including the 3D DRAM device to achieve an operating temperature at or below 0° C. Any active cooling structure discussed herein may be provided at operation 1208. For example, die level active cooling may be formed by etching the void structures of the microchannels followed by deposition techniques to enclose the void structures. For example, microchannels 801 to convey a heat transfer fluid therein may be formed at operation 1208. In addition or in the alternative, a package level active cooling structure is provided. In some embodiments, active cooling structure 901 having microchannels 902 may be separately formed and attached to an IC die separated from a wafer. For example, the wafer may be diced, each IC die may be packaged and an active cooling structure 901 may be attached thereto. In some embodiments, a two-phase immersion cooling system as discussed with respect to FIG. 11 is provided as the package level active cooling structure. Processing ends at operation 1209 where the resultant device or system is output for use.

Figure 13:
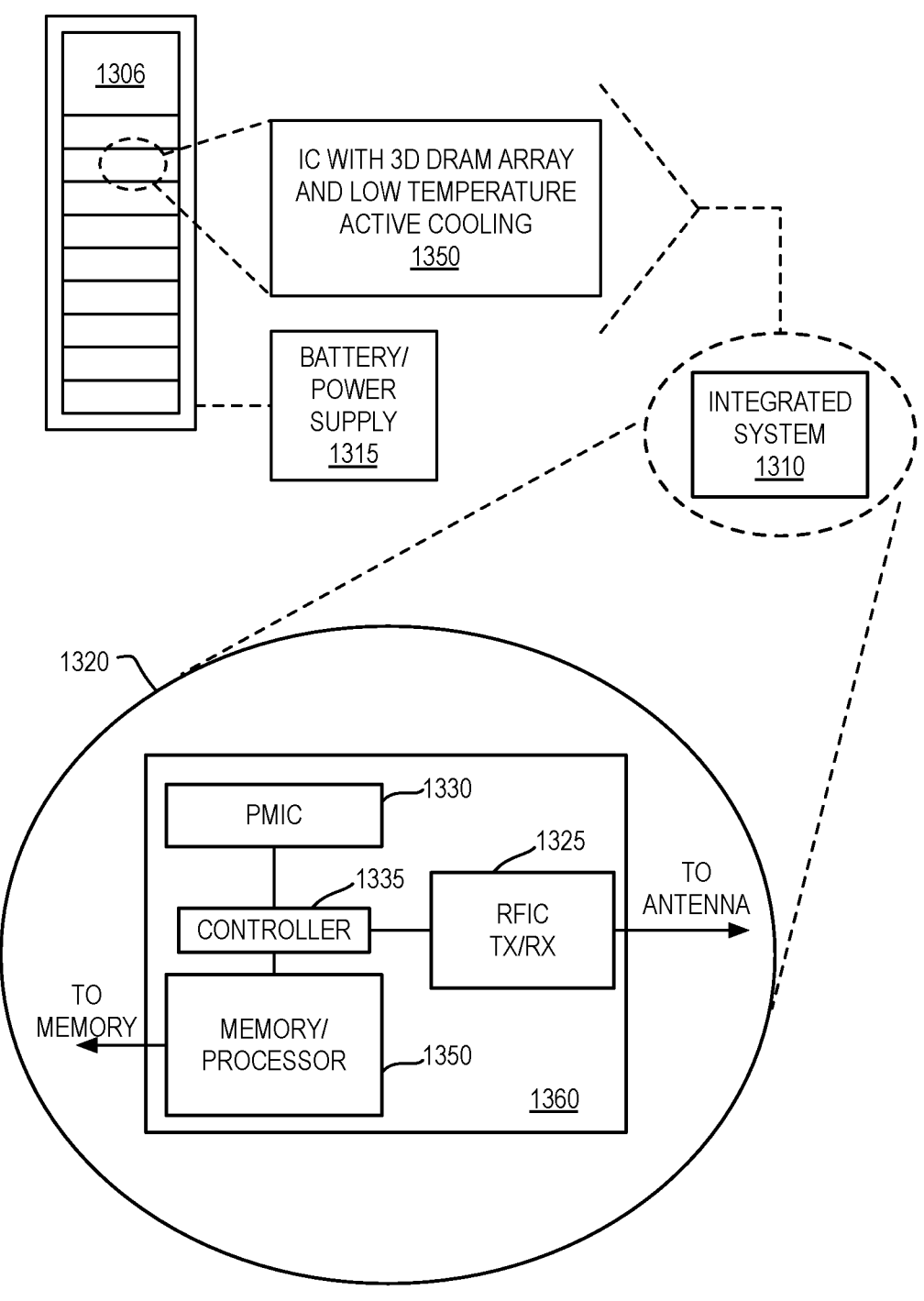
FIG. 13 illustrates diagram of an example data server machine employing a low temperature 3D dynamic random access memory integrated circuit system.

FIG. 13 illustrates diagram of an example data server machine 1306 employing a low temperature 3D dynamic random access memory integrated circuit system, arranged in accordance with at least some implementations of the present disclosure. Server machine 1306 may be any commercial server, for example, including any number of high-performance computing platforms disposed within a rack and networked together for electronic data processing, which in the exemplary embodiment includes one or more devices 1350 having an integrated circuit with 3D DRAM and optional low temperature active cooling operable to remove heat from the integrated circuit to achieve any low operating temperature discussed herein.

Also as shown, server machine 1306 includes a battery and/or power supply 1315 to provide power to devices 1350, and to provide, in some embodiments power delivery functions such as power regulation. Devices 1350 may be deployed as part of a package-level integrated system 1310. Integrated system 1310 is further illustrated in the expanded view 1320. In the exemplary embodiment, devices 1350 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1350 is a microprocessor including an SRAM cache memory. As shown, device 1350 may employ a die or device having any transistor structures and/or related characteristics discussed herein. Device 1350 may be further coupled to (e.g., communicatively coupled to) a board, a substrate, or an interposer 1360 along with, one or more of a power management integrated circuit (PMIC) 1330, RF (wireless) integrated circuit (RFIC) 1325 including a wideband RF (wireless) transmitter and/or receiver (TX/RX) (e.g., including a digital baseband and an analog front end module further comprises a power amplifier on a transmit path and a low noise amplifier on a receive path), and a controller 1335 thereof.

Figure 14:
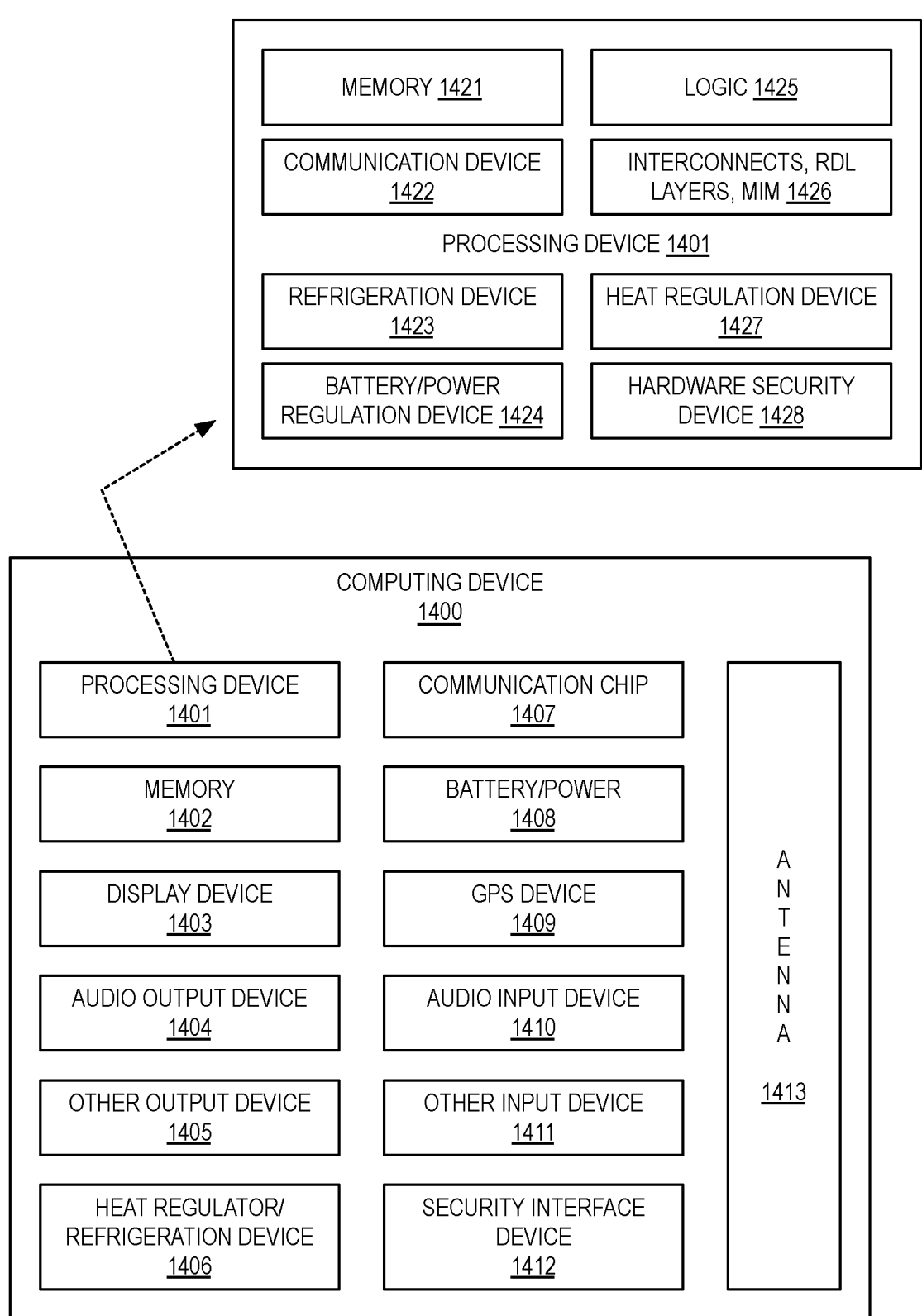
FIG. 14 is a block diagram of an example computing device, all arranged in accordance with at least some implementations of the present disclosure.

FIG. 14 is a block diagram of an example computing device 1400, arranged in accordance with at least some implementations of the present disclosure. For example, one or more components of computing device 1400 may include any of the devices or structures discussed herein. A number of components are illustrated in FIG. 14 as being included in computing device 1400, but any one or more of these components may be omitted or duplicated, as suitable for the application. In some embodiments, some or all of the components included in computing device 1400 may be attached to one or more printed circuit boards (e.g., a motherboard). In some embodiments, various ones of these components may be fabricated onto a single system-on-a-chip (SoC) die. Additionally, in various embodiments, computing device 1400 may not include one or more of the components illustrated in FIG. 14, but computing device 1400 may include interface circuitry for coupling to the one or more components. For example, computing device 1400 may not include a display device 1403, but may include display device interface circuitry (e.g., a connector and driver circuitry) to which display device 1403 may be coupled. In another set of examples, computing device 1400 may not include an audio output device 1404, other output device 1405, global positioning system (GPS) device 1409, audio input device 1410, or audio input device 1411, but may include audio output device interface circuitry, other output device interface circuitry, GPS device interface circuitry, audio input device interface circuitry, audio input device interface circuitry, to which audio output device

1404, other output device 1405, GPS device 1409, audio input device 1410, or audio input device 1411 may be coupled.

Computing device 1400 may include a processing device 1401 (e.g., one or more processing devices). As used herein, the term processing device or processor indicates a device that processes electronic data from registers and/or memory to transform that electronic data into other electronic data that may be stored in registers and/or memory. Processing device 1401 may include a memory 1421, a communication device 1422, a refrigeration device 1423, a battery/power regulation device 1424, logic 1425, interconnects 1426 (i.e., optionally including redistribution layers (RDL) or metal-insulator-metal (MIM) devices), a heat regulation device 1427, and a hardware security device 1428.

Processing device 1401 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Computing device 1400 may include a memory 1402, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1402 includes memory that shares a die with processing device 1401. This memory may be used as cache memory and may include embedded dynamic random-access memory (eDRAM) or spin transfer torque magnetic random-access memory (STT-M RAM).

Computing device 1400 may include a heat regulation/refrigeration device 1406. Heat regulation/refrigeration device 1406 may maintain processing device 1401 (and/or other components of computing device 1400) at a predetermined low temperature during operation. This predetermined low temperature may be any temperature discussed herein.

In some embodiments, computing device 1400 may include a communication chip 1407 (e.g., one or more communication chips). For example, the communication chip 1407 may be configured for managing wireless communications for the transfer of data to and from computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1407 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1407 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1407 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1407 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1407 may operate in accordance with other wireless protocols in other embodiments. Computing device 1400 may include an antenna 1413 to facilitate wireless communications and/or to receive other wireless communications (such as AM or FM radio transmissions).

In some embodiments, communication chip 1407 may manage wired communications, such as electrical, optical, or any other suitable communication protocols (e.g., the Ethernet). As noted above, communication chip 1407 may include multiple communication chips. For instance, a first communication chip 1407 may be dedicated to shorter-range wireless communications such as Wi-Fi or Bluetooth, and a second communication chip 1407 may be dedicated to longer-range wireless communications such as GPS, EDGE, GPRS, CDMA, WiMAX, LTE, EV-DO, or others. In some embodiments, a first communication chip 1407 may be dedicated to wireless communications, and a second communication chip 1407 may be dedicated to wired communications.

Computing device 1400 may include battery/power circuitry 1408. Battery/power circuitry 1408 may include one or more energy storage devices (e.g., batteries or capacitors) and/or circuitry for coupling components of computing device 1400 to an energy source separate from computing device 1400 (e.g., AC line power).

Computing device 1400 may include a display device 1403 (or corresponding interface circuitry, as discussed above). Display device 1403 may include any visual indicators, such as a heads-up display, a computer monitor, a projector, a touchscreen display, a liquid crystal display (LCD), a light-emitting diode display, or a flat panel display, for example.

Computing device 1400 may include an audio output device 1404 (or corresponding interface circuitry, as discussed above). Audio output device 1404 may include any device that generates an audible indicator, such as speakers, headsets, or earbuds, for example.

Computing device 1400 may include an audio input device 1410 (or corresponding interface circuitry, as discussed above). Audio input device 1410 may include any device that generates a signal representative of a sound, such as microphones, microphone arrays, or digital instruments (e.g., instruments having a musical instrument digital interface (MIDI) output).

Computing device 1400 may include a global positioning system (GPS) device 1409 (or corresponding interface circuitry, as discussed above). GPS device 1409 may be in communication with a satellite-based system and may receive a location of computing device 1400, as known in the art.

Computing device 1400 may include other output device 1405 (or corresponding interface circuitry, as discussed above). Examples of the other output device 1405 may include an audio codec, a video codec, a printer, a wired or wireless transmitter for providing information to other devices, or an additional storage device.

Computing device 1400 may include other input device 1411 (or corresponding interface circuitry, as discussed above). Examples of the other input device 1411 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1400 may include a security interface device 1412. Security interface device 1412 may include any device that provides security measures for computing device 1400 such as intrusion detection, biometric validation, security encode or decode, access list management, malware detection, or spyware detection, Computing device 1400, or a subset of its components, may have any appropriate form factor, such as a hand-held or mobile computing device (e.g., a cell phone, a smart phone, a mobile internet device, a music player, a tablet computer, a laptop computer, a netbook computer, an ultra-book computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following pertain to further embodiments.

In one or more first embodiments, a memory device comprises a plurality of vertically aligned semiconductor structures, a plurality of independent gate structures, each gate structure coupled to a corresponding one of the semiconductor structures, a plurality of vertically aligned capacitors, each capacitor coupled to a corresponding one of the semiconductor structures and laterally aligned with a corresponding one of the gate structures, and a bit line contact extending vertically across a depth of the semiconductor structures, the bit line contact coupled to each of the semiconductor structures.

In one or more second embodiments, further to the first embodiments, the gate structures are laterally between the capacitors and the bit line contact, and the memory device further comprises a plurality of second independent gate structures, each second gate structure coupled to a corresponding one of the semiconductor structures and a plurality of second vertically aligned capacitors, each second capacitor coupled to a corresponding one of the semiconductor structures and laterally aligned with a corresponding one of the second gate structures, wherein the bit line contact is shared to provide access to the capacitors and the second capacitors.

In one or more third embodiments, further to the first or second embodiments, the memory device further comprises a plurality of third vertically aligned capacitors, each third capacitor immediately laterally adjacent a corresponding one of the second capacitors.

In one or more fourth embodiments, further to the first through third embodiments, an outer capacitor plate of each of the second and third capacitors are in contact with a shared capacitor contact.

In one or more fifth embodiments, further to the first through fourth embodiments, a first of the capacitors comprises a first capacitor plate surrounding a portion of a first of the semiconductor structures, a capacitor dielectric surrounding the first capacitor plate, and a second capacitor plate surrounding the capacitor dielectric.

In one or more sixth embodiments, further to the first through fifth embodiments, the memory device further comprises a shared capacitor contact extending vertically across a depth of the capacitors and in contact with the second capacitor plate.

In one or more seventh embodiments, further to the first through sixth embodiments, a first of the capacitors comprises a first capacitor plate laterally adjacent to a first of the semiconductor structures, a capacitor dielectric adjacent to the first capacitor plate, and a second capacitor plate adjacent to the capacitor dielectric.

In one or more eighth embodiments, further to the first through seventh embodiments, the bit line contact comprises a source or drain material epitaxial to the semiconductor structures.

In one or more ninth embodiments, further to the first through eighth embodiments, the semiconductor structures comprise a plurality of nanoribbons, a plurality of nanosheets, or a plurality of fins.

In one or more tenth embodiments, further to the first through ninth embodiments, a first of the semiconductor structures has a thickness in the vertical direction of not more than 2 nm.

In one or more eleventh embodiments, further to the first through tenth embodiments, the memory device further comprises a cooling structure operable to remove heat from an IC die comprising the semiconductor structures to achieve an operating temperature at or below −25° C.

In one or more twelfth embodiments, a memory device comprises a plurality of vertically aligned semiconductor structures, a bit line contact extending vertically across a depth of the semiconductor structures, the bit line contact coupled to each of the semiconductor structures, a plurality of first gate structures, each first gate structure coupled to a corresponding one of the semiconductor structures, a plurality of second gate structures opposite the bit line from the first gate structures, each second gate structure coupled to a corresponding one of the semiconductor structures, a plurality of first vertically aligned capacitors, each first capacitor coupled to a corresponding one of the semiconductor structures and laterally aligned with a corresponding one of the first gate structures, and a plurality of second vertically aligned capacitors opposite the bit line from the first capacitors, each second capacitor coupled to a corresponding one of the semiconductor structures and laterally aligned with a corresponding one of the second gate structures.

In one or more thirteenth embodiments, further to the twelfth embodiments, the memory device further comprises a plurality of third vertically aligned capacitors, each third capacitor immediately laterally adjacent a corresponding one of the second capacitors.

In one or more fourteenth embodiments, further to the twelfth or thirteenth embodiments, an outer capacitor plate of each of the second and third capacitors are in contact with a shared capacitor contact.

In one or more fifteenth embodiments, further to the twelfth through fourteenth embodiments, each of the first capacitors comprises a first capacitor plate surrounding a portion of a corresponding one of the semiconductor structures, a capacitor dielectric surrounding the first capacitor plate, and a second capacitor plate surrounding the capacitor dielectric.

In one or more sixteenth embodiments, further to the twelfth through fifteenth embodiments, the bit line contact comprises a source or drain material epitaxial to the semiconductor structures.

In one or more seventeenth embodiments, a system comprises an IC die having a memory device according to any of the first through sixteenth embodiments, and a power supply coupled to the IC die.

In one or more eighteenth embodiments, a system comprises an integrated circuit (IC) die comprising a memory array comprising a plurality of vertically aligned semiconductor structures, a plurality of independent gate structures, each gate structure coupled to a corresponding one of the semiconductor structures, a plurality of vertically aligned capacitors, each capacitor coupled to a corresponding one of the semiconductor structures and laterally aligned with a corresponding one of the gate structures, and a bit line contact extending vertically across a depth of the semiconductor structures, the bit line contact coupled to each of the semiconductor structures, and a power supply coupled to the IC die.

In one or more nineteenth embodiments, further to the eighteenth embodiments, the gate structures are laterally between the capacitors and the bit line contact, and the memory array further comprises a plurality of second independent gate structures, each second gate structure coupled to a corresponding one of the semiconductor structures and a plurality of second vertically aligned capacitors, each second capacitor coupled to a corresponding one of the semiconductor structures and laterally aligned with a corresponding one of the second gate structures, wherein the bit line contact is shared to provide access to the capacitors and the second capacitors.

In one or more twentieth embodiments, further to the eighteenth or nineteenth embodiments, the memory array further comprises a plurality of third vertically aligned capacitors, each third capacitor immediately laterally adjacent a corresponding one of the second capacitors.

In one or more twenty-first embodiments, further to the eighteenth through twentieth embodiments, an outer capacitor plate of each of the second and third capacitors are in contact with a shared capacitor contact.

In one or more twenty-second embodiments, further to the eighteenth through twenty-first embodiments, each of the first capacitors comprises a first capacitor plate surrounding a portion of a corresponding one of the semiconductor structures, a capacitor dielectric surrounding the first capacitor plate, and a second capacitor plate surrounding the capacitor dielectric.

In one or more twenty-third embodiments, further to the eighteenth through twenty-second embodiments, the bit line contact comprises a source or drain material epitaxial to the semiconductor structures.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A memory device, comprising:
a plurality of vertically aligned semiconductor structures extending laterally;

a plurality of independent gate structures, each gate structure coupled to a corresponding one of the semiconductor structures;

a plurality of vertically aligned capacitors, each capacitor coupled to a corresponding one of the semiconductor structures and laterally aligned with a corresponding one of the gate structures and each capacitor comprising a wraparound structure comprising an inner capacitor plate surrounding and in contact with a portion of the corresponding one of the semiconductor structures, a capacitor dielectric surrounding and in contact with the inner capacitor plate, and an outer capacitor plate surrounding and in contact with the capacitor dielectric;

a bit line contact extending vertically across a depth of the semiconductor structures, the bit line contact coupled to each of the semiconductor structures; and a shared capacitor contact extending vertically across a depth of the capacitors and in contact with the outer capacitor plates.

2. The memory device of claim 1, wherein the gate structures are laterally between the capacitors and the bit line contact, the memory device further comprising:

a plurality of second independent gate structures, each second gate structure coupled to a corresponding one of the semiconductor structures; and a plurality of second vertically aligned capacitors, each second capacitor coupled to a corresponding one of the semiconductor structures and laterally aligned with a corresponding one of the second gate structures, wherein the bit line contact is shared to provide access to the capacitors and the second capacitors.

3. The memory device of claim 2, further comprising:

a plurality of third vertically aligned capacitors, each third capacitor immediately laterally adjacent a corresponding one of the second capacitors.

4. The memory device of claim 3, wherein an outer capacitor plate of each of the second and third capacitors are in contact with a shared capacitor contact.

5. The memory device of claim 1, wherein the bit line contact comprises a source or drain material epitaxial to the semiconductor structures.

6. The memory device of claim 1, wherein the semiconductor structures comprise a plurality of nanoribbons, a plurality of nanosheets, or a plurality of fins.

7. The memory device of claim 1, wherein a first of the semiconductor structures has a thickness in the vertical direction of not more than 2 nm.

8. The memory device of claim 1, further comprising:

an integrated circuit (IC) die comprising the semiconductor structures, the gate structures, the capacitors, the bit line contact, and the capacitor contact; and a power supply coupled to the IC die and/or a cooling structure operable to remove heat from the IC die to achieve an operating temperature at or below −25° C.

9. A memory device, comprising:

a plurality of vertically aligned semiconductor structures extending laterally;

a bit line contact extending vertically across a depth of the semiconductor structures, the bit line contact coupled to each of the semiconductor structures;

a plurality of first gate structures, each first gate structure coupled to a corresponding one of the semiconductor structures;

a plurality of second gate structures opposite the bit line from the first gate structures such that the bit line contact is between the first gate structures and the second gate structures, each second gate structure coupled to a corresponding one of the semiconductor structures;

a plurality of first vertically aligned capacitors, each first capacitor coupled to a corresponding one of the semiconductor structures and laterally aligned with a corresponding one of the first gate structures; and a plurality of second vertically aligned capacitors opposite the bit line from the first capacitors such that the bit line contact, the first gate structures, and the second gate structures are between the first capacitors and the second capacitors, each second capacitor coupled to a corresponding one of the semiconductor structures and laterally aligned with a corresponding one of the second gate structures.

10. The memory device of claim 9, further comprising:

a plurality of third vertically aligned capacitors, each third capacitor immediately laterally adjacent a corresponding one of the second capacitors.

11. The memory device of claim 10, wherein an outer capacitor plate of each of the second and third capacitors are in contact with a shared capacitor contact.

12. The memory device of claim 9, wherein each of the first capacitors comprises a wraparound structure comprising an inner capacitor plate surrounding and in contact with a portion of the corresponding one of the semiconductor structures, a capacitor dielectric surrounding and in contact with the inner capacitor plate, and an outer capacitor plate surrounding and in contact with the capacitor dielectric.

13. The memory device of claim 9, wherein the bit line contact comprises a material epitaxial to each of the semiconductor structures, the material extending vertically across the depth of the semiconductor structures.

14. The memory device of claim 9, further comprising:

an integrated circuit (IC) die comprising the semiconductor structures, the bit line contact, the first gate structures, the second gate structures, the first capacitors, and the second capacitors; and a power supply coupled to the IC die and/or a cooling structure operable to remove heat from the IC die to achieve an operating temperature at or below −25° C.

15. A memory device, comprising:

a plurality of vertically aligned semiconductor structures extending laterally;

a plurality of independent gate structures, each gate structure coupled to a corresponding one of the semiconductor structures;

a plurality of vertically aligned capacitors, each capacitor coupled to a corresponding one of the semiconductor structures and laterally aligned with a corresponding one of the gate structures; and a bit line contact extending vertically across a depth of the semiconductor structures, the bit line contact coupled to each of the semiconductor structures and the bit line contact comprising a material epitaxial to each of the semiconductor structures, the material extending vertically across the depth of the semiconductor structures.

16. The memory device of claim 15, wherein the gate structures are laterally between the capacitors and the bit line contact, the memory device further comprising:

a plurality of second independent gate structures, each second gate structure coupled to a corresponding one of the semiconductor structures; and a plurality of second vertically aligned capacitors, each second capacitor coupled to a corresponding one of the semiconductor structures and laterally aligned with a corresponding one of the second gate structures, wherein the bit line contact is shared to provide access to the capacitors and the second capacitors.

17. The memory device of claim 16, further comprising:

a plurality of third vertically aligned capacitors, each third capacitor immediately laterally adjacent a corresponding one of the second capacitors.

18. The memory device of claim 17, wherein an outer capacitor plate of each of the second and third capacitors are in contact with a shared capacitor contact.

19. The memory device of claim 15, wherein the bit line contact comprises a source or drain material epitaxial to the semiconductor structures.

20. The memory device of claim 15, wherein the semiconductor structures comprise a plurality of nanoribbons, a plurality of nanosheets, or a plurality of fins.

21. The memory device of claim 15, wherein a first of the semiconductor structures has a thickness in the vertical direction of not more than 2 nm.

22. The memory device of claim 15, further comprising:

an integrated circuit (IC) die comprising the semiconductor structures, the gate structures, the capacitors, and the bit line contact; and a power supply coupled to the IC die and/or a cooling structure operable to remove heat from the IC die to achieve an operating temperature at or below −25° C.

* * * * *